United States Patent
Gorbachov et al.

(10) Patent No.: US 10,587,028 B1
(45) Date of Patent: Mar. 10, 2020

(54) RADIO FREQUENCY COUPLERS WITH HIGH DIRECTIVITY

(71) Applicant: OctoTech, Inc., Irvine, CA (US)

(72) Inventors: Oleksandr Gorbachov, Irvine, CA (US); Lisette L. Zhang, Redondo Beach, CA (US)

(73) Assignee: BEREX CORPORATION, Seoul (KR)

( * ) Notice: Subject to any disclaimer, the term of this patent is extended or adjusted under 35 U.S.C. 154(b) by 35 days.

(21) Appl. No.: 16/122,483

(22) Filed: Sep. 5, 2018

Related U.S. Application Data

(60) Provisional application No. 62/615,155, filed on Jan. 9, 2018.

(51) Int. Cl.
  *H01P 5/18* (2006.01)
  *H03H 7/48* (2006.01)
  *H04B 1/525* (2015.01)

(52) U.S. Cl.
  CPC .............. *H01P 5/18* (2013.01); *H03H 7/48* (2013.01); *H04B 1/525* (2013.01)

(58) Field of Classification Search
  CPC .................................. H01P 5/18; H03H 7/48
  USPC ................... 333/109, 111, 112, 116
  See application file for complete search history.

(56) References Cited

U.S. PATENT DOCUMENTS

| | | | |
|---|---|---|---|
| 7,446,626 B2 | 11/2008 | Gorbachov | |
| 8,928,428 B2 | 1/2015 | Gorbachov | |
| 9,093,734 B2 | 7/2015 | Gorbachov | |
| 2015/0042412 A1* | 2/2015 | Imbornone | H01P 5/18 333/112 |
| 2016/0028146 A1 | 1/2016 | Gorbachov | |

OTHER PUBLICATIONS

Authors Y. Zhu, H. Wu; Title: 10-40GHz 7dB Directional Coupler in Digital CMOS Technology. 2006 International Microwave Symposium.

Authors: V.T. Vo, L. Krishnamurthy, Q. Sun, G. Parkinson, A.A. Rezazadeh. Title: Design and Realization of CPW Multilayer Couplers for Broadband Applications. Edinburgh 2005.

* cited by examiner

*Primary Examiner* — Dean O Takaoka
(74) *Attorney, Agent, or Firm* — Eric Karich; Karich & Associates

(57) ABSTRACT

A directional coupler has a first port, a second port, a third port, and a fourth port. A first inductor has a first connection to the first port and a second connection to the second port. A second inductor has a first connection to the third port and a second connection to the fourth port. A first compensation capacitor is connected to the first port and the third port. A second compensation capacitor is connected to the first port and the fourth port. The first inductor is inductively coupled to the second inductor by a predefined coupling factor, the third port is isolated from the first port by a predefined first isolation factor, and the fourth port is isolated from the first port by a predefined second isolation factor. An inductance of the second inductor is substantially greater than an inductance of the first inductor.

20 Claims, 26 Drawing Sheets

Coupling: S31 and S42  
Return Loss: S11, S22, S33 and S44  
Isolation: S32 and S41

Dashed lines - known solution [2] same as in Fig.5  
Solid lines - Proposal 1

RADIO FREQUENCY COUPLERS WITH HIGH DIRECTIVITY

CROSS-REFERENCE TO RELATED APPLICATION

This application claims priority to U.S. Provisional Patent Application No. 62/615,155, filed Jan. 9, 2018, the contents of which are herein incorporated by reference in their entirety.

TECHNICAL FIELD

The present disclosure relates to radio frequency (RF) couplers, and more particularly to RF couplers with high directivity.

BACKGROUND

Directional couplers are passive devices utilized to couple a part of the transmission power on one signal path to another signal path by a predefined amount. Conventionally, this is achieved by placing the two signal paths in close physical proximity to each other, such that the energy passing through one is passed to the other. This property is useful for a number of different applications, including power monitoring and control, testing and measurements, and so forth.

The directional coupler is a four-port device including an input port (P1), an output port (P2), a coupled port (P3), and an isolated or ballast port (P4). The power supplied to P1 is coupled to P3 according to a coupling factor that defines the fraction of the input power that is passed to P3. The remainder of the power on P1 is delivered to P2, and in an ideal case, no power is delivered to P4. The degree to which the forward and backward waves are isolated is the directivity of the coupler, and again, in an ideal case, would be infinite. Directivity may also be defined as the difference between S31 (coupling coefficient) and S32 (reverse isolation). In an actual implementation, however, some level of the signal is passed to both to P3 and P4, though the addition of a ballasting resistor to P4 may be able to dissipate some of the power.

The type of transmission lines utilized in such conventional directional couplers includes coaxial lines, strip lines, and micro strip lines. The geometric dimensions are proportional to the wavelength of transmitted signal for a given coupling coefficient. Directional couplers utilizing lumped element components are known in the art, but such devices are also dimensionally large. These devices are implemented with ceramic substrates and thin-film printed metal traces and have footprints of 2×1.6 mm and 1.6×0.8 mm and above, which is much larger than semiconductor die implementations. Notwithstanding the relatively large physical coupling area of the transmission lines, such directional couplers only have a directivity of around 10 dB. The resultant power control accuracy is approximately +/−0.45 dB at 50 ohm load. Such performance is unsuitable for many applications including mobile communications, where high voltage standing wave ratios (VSWR) at the antenna are possible.

Instead of lumped element circuits, directional couplers may be based on integrated passive devices (IPD) technology and implemented on wafer level chip scale packaging (WL-CSP). Due to the footprint restrictions, implementation of directional couplers on semiconductor dies is generally limited to microwave and millimeter wave operating frequencies. These types of directional couplers utilize two coupled inductors or two coupled lines. Although suitable for on-die implementations, such couplers exhibit low levels of directivity due to the small geometric dimensions. With a mismatch on the output port (P2), the reflect signal may leak to the coupled port (P3) and mix with the originally coupled signal, thereby resulting in a high level of uncertainly in measurements of transferred power to the output port P2. Even with higher coupling coefficients possible with increasing the number of turns in inter-wound micro strip line coupled inductors, directivity remains low.

An improvement over the basic coupled inductor architecture is disclosed in U.S. Pat. No. 7,446,626. In addition to the coupled inductors, there is a compensation capacitor and a compensation resistor that are understood to provide a high level of directivity (around 60 db) notwithstanding the small geometry. With the use of low inductance values, low insertion loss resulted. However, there are several deficiencies with such earlier directional couplers. The lumped element capacitors utilized therein are only capable of sustaining a limited voltage level. In typical metal-insulator-metal (MIM) capacitors, the breakdown voltage ranges from 5V to 30V, depending on the particular semiconductor technology utilized. Conventional techniques for increasing capacitive density involve reducing the thickness of the dielectric between the metal plates to several hundred angstroms, and though the footprint is reduced, so is the breakdown voltage. The use of the aforementioned compensation resistor for achieving high directivity across a wide frequency range is also problematic in that a more expensive semiconductor process must be utilized. It is possible in some instances to exclude the compensation resistor, but this results in reduced directivity.

SUMMARY

The following presents a simplified summary of various aspects of this disclosure to provide a basic understanding of such aspects. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one embodiment, the invention provides a directional coupler having a first port, a second port, a third port, and a fourth port. A first inductor has a first connection to the first port and a second connection to the second port. A second inductor has a first connection to the third port and a second connection to the fourth port. A first compensation capacitor is connected to the first port and the third port. A second compensation capacitor is connected to the first port and the fourth port. The first inductor is inductively coupled to the second inductor by a predefined coupling factor, the third port is isolated from the first port by a predefined first isolation factor, and the fourth port is isolated from the first port by a predefined second isolation factor. An inductance of the second inductor is substantially greater than an inductance of the first inductor.

BRIEF DESCRIPTION OF THE DRAWINGS

The accompanying drawings illustrate the present invention. In such drawings.

DETAILED DESCRIPTION

Figure 1:
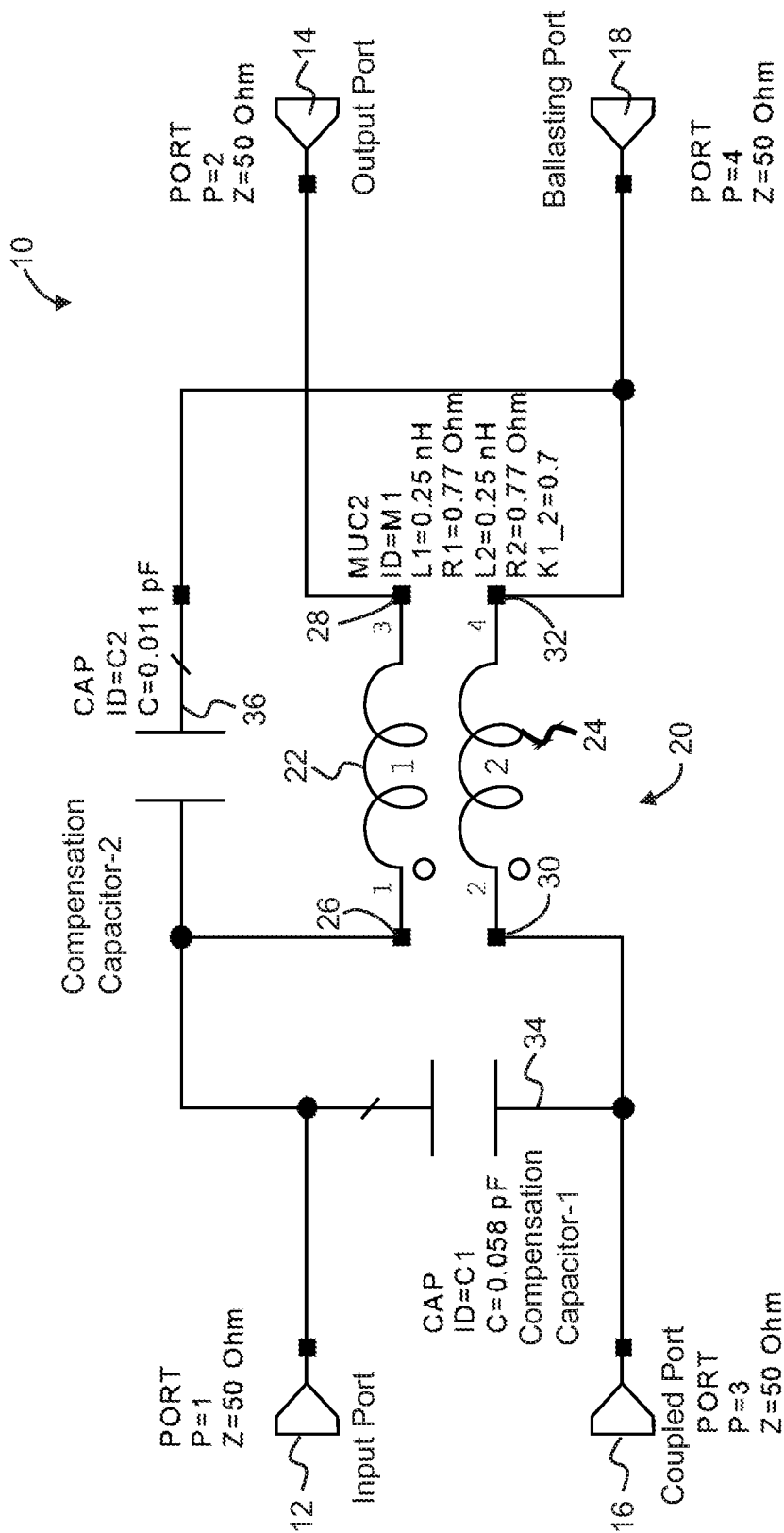
FIG. 1 is a schematic diagram illustrating a prior art directional coupler.

Aspects and implementations of the present disclosure are directed to directional RF couplers with high directivity. Traditionally, RF directional couplers used in different applications (i.e., power monitor and control) and may be large in size. Typically, these couplers are based on coupling between two transmission lines (coaxial, micro-strip, etc.) and their geometrical dimensions are proportional to the wave length of a signal for particular coupling coefficient. Thus, implementation of these couplers on semiconductor die is typically limited by millimeter wave frequencies. For example, reference [3] describes directional coupler for 10-40 GHz frequency range which longitudinal dimension of coupler is 934 um long. Coupler is based on CMOS process and comprised of two coupled transmission lines.

Other types of RF couplers are based on a lumped-element approach which may provide a simplified topology, however, the dimensions of these couplers may also be large.

Couplers based on architectures of coupled inductors may be suited for on-die implementations however they may suffer from a low level of directivity and coupling coefficient due to a small geometrical size.

Some directional couplers may be suited for on-die implementation. One example of a direction coupler suited for on-die implementation may be based on two coupled inductors with a compensation capacitor and a compensation resistor which provides a high level of directivity even with small geometries.

Direction couplers may include two coupled inductors and two or three compensation capacitors (at a circuit level).

Physical implementation of coupled inductors may include two metal coils in one metal layer placed in close proximity to each other.

Physical implementation of compensation capacitors may include one or several metal stubs placed at a second metal layer in which one of terminals may be electrically connected to one of the coils while a stub is overlapped with another coil. Thus, capacitance may be comprised of two metal traces at different metal layers and dielectric material in between them.

Some couplers may use both distributed inductive (magnetic field) and capacitive (electrical field) coupling.

Therefore, there is a need for an improved RF directional coupler capable of high operating voltages, high directivity, and low insertion loss and implemented on lower semiconductor technologies. Implementations of the disclosure address the above deficiencies by providing an RF directional coupler that may be small in size yet provide reasonable performance.

Proposed directional couplers for cellular applications (Wide Band Code Division Multiple Access (WCDMA), Long Term Evolution (LTE), etc.) may contain multiple inductors in a main signal chain and multiple inductors in a coupled chain along with compensation capacitors. This may result in a reduced footprint area for a coupler on a semiconductor die.

Newly proposed RF directional couplers of the present disclosure may utilize coupled inductors on different metal layers of a semiconductor die while a coupled inductor may have a significantly higher inductor coil value to increase coupling. Realization of coupled inductors in different metal layers may further increase coupling compared to known solutions. Compensation capacitors may be used to increase directivity. The present disclosure may use additional compensation capacitors between a main signal trace and a coupled metal trace to ground plane, unlike known solutions.

The present disclosure may reduce noise coupling from a semiconductor substrate to highly sensitive coupled coil chain.

Various aspects of the above referenced methods and systems are described in detail herein below by way of examples, rather than by way of limitation.

There are several performance objectives that are applicable to RF directional couplers, including high directivity, high power levels, low insertion loss, and low sensitivity to variations in other connected electrical components. Various implementations of the present disclosure contemplate directional couplers that meet these objectives as explained in more detail below, and further have additional practical advantageous characteristics such as decreased size, and simplified, low-cost implementation, among others.

Figure 2:
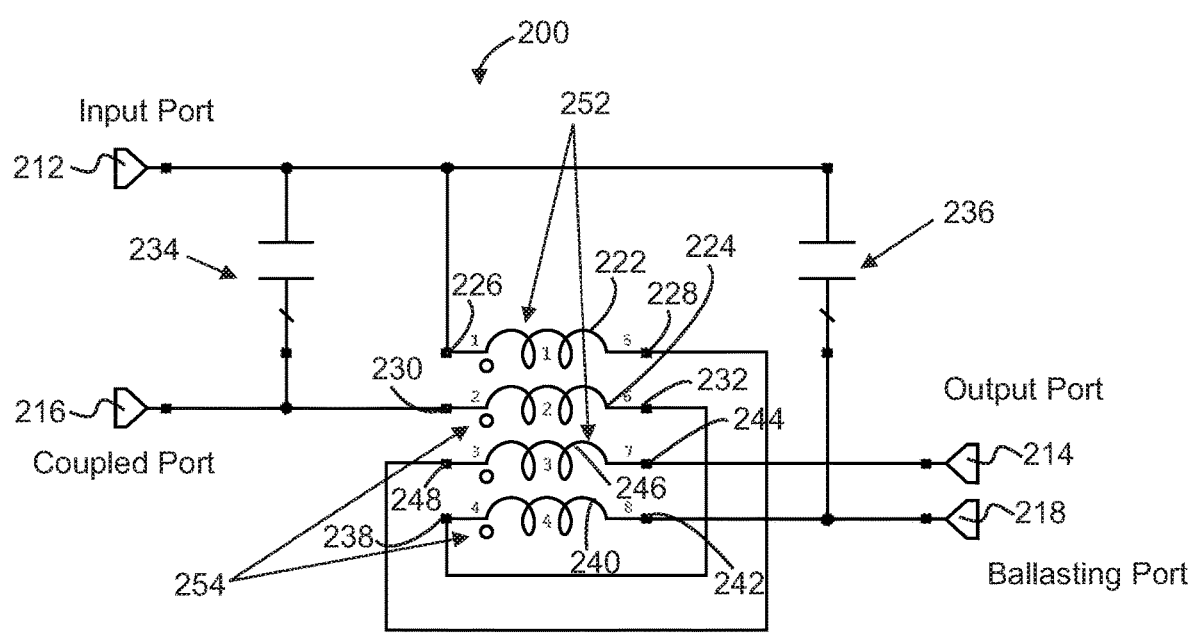
FIG. 2 is a schematic diagram illustrating another prior art directional coupler.
Figure 3:
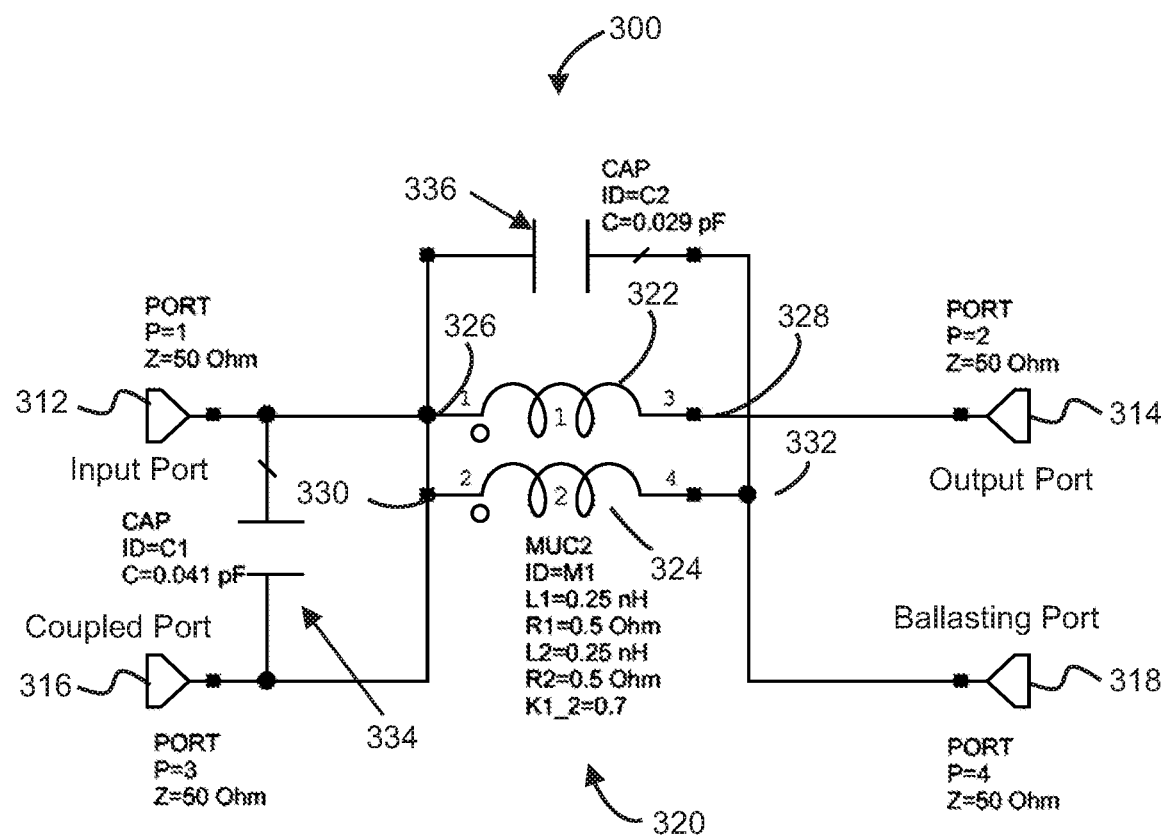
FIG. 3 is a schematic diagram illustrating a prior art directional coupler including various component values.

Prior art directional couplers are described herein with respect to FIGS. 1-3. FIG. 1 is a schematic diagram illustrating a prior art directional coupler 10. Coupler 10 has an input port 12, an output port 14, a coupled port 16, and a ballasting port 18. For a directional coupler in the general case, a portion of the signal that is applied to the input port 12 is passed through to the output port 14, and another portion of the same is passed to the coupled port 16. Although in an ideal case, the signal is not passed to the ballasting port 18, in a typical implementation, at least a minimal signal level is present. For purposes of discussing and graphically illustrating the scattering parameters (S-Parameters) of the four-port device that is the directional coupler 10, the input port 12 may be referred to as port P1, the output port 14 may be referred to as port P2, the coupled port 16 may be referred to as port P3, and the ballasting port 18 may be referred to as port P4. Each of the ports is understood to have a characteristic impedance of 50 Ohm for standard matching of components.

Notwithstanding the foregoing naming conventions of the various ports of the directional coupler, it is possible to apply a signal to the port P3 (coupled port 16) that is passed to port P4 (ballasting port 18), with a portion thereof being passed to the port P1 (input port 12) and minimized at the port P2 (output port 14). In other words, the ports P1 and P2 are functionally reciprocal with the ports P3 and P4. It is understood, however, that directivity may be different between when the signal is applied to port P1 versus when the signal is applied to port P2. In an implementation, directivity for signals applied to port P1 and P3 may be the same. In an implementation, coupled lines (or traces) may have smaller (or narrower) trace elements to conduct less power than non-coupled lines. Although not entirely symmetric, in both cases there is contemplated to be sufficient directivity for most applications. Along these lines, the port P2 can be utilized as the input port while port P1 can be utilized as the output port. According to such use, it follows that the port P4 is the coupled port and the port P3 is the ballasting port. Another configuration where the port P4 is utilized as the input port, then the output port will be the port P3, while the port P2 will be the coupled port and the port P1 will be the ballasting port. The loss between port P1 and port P2, and the loss between port P3 and port P4 may be different if the widths and thicknesses of the conductive traces of the directional coupler 10, discussed in greater detail below, are different.

The directional coupler 10 further includes coupled inductors 20 that are comprised of a first transmission element 22 and a second transmission element 24. The first transmission element 22 and the second transmission element 24 may also be referred to individually as inductors. The first transmission element 22 has a first connection 26 to the input port 12 and a second connection 28 to the output port 14. Furthermore, the second transmission element 24 has another first connection 30 to the coupled port 16 and another second connection 32 to the ballasting port 18. As depicted, the first transmission element 22 or inductor, as well as the second transmission element 24 or inductor, have exemplary inductance values of 0.25 nH, and an exemplary resistance of 0.77 Ohm. The exemplary inductance and resistance values are provided for exemplary purposes only and may vary.

The directional coupler 10 includes a first compensation capacitor 34 that is connected to the input port 12 and the coupled port 16, in addition to a second compensation capacitor 36 that is connected to the input port 12 and the ballasting port 18. As depicted, the first compensation capacitor 34 may have a capacitance value of 0.058 pF, while the second compensation capacitor 36 may have a capacitance value of 0.11 pF.

FIG. 2 is a schematic diagram illustrating a prior art directional coupler 200. Coupler 200 has an input port 212, an output port 214, a coupled port 216, and a ballasting port

218. As described above, for a directional coupler in the general case, a portion of the signal that is applied to the input port 212 is passed through to the output port 214, and another portion of the same is passed to the coupled port 216. Although in an ideal case, the signal is not passed to the ballasting port 218, in a typical implementation, at least a minimal signal level is present. The input port 212 may be referred to as port P1, the output port 214 may be referred to as port P2, the coupled port 216 may be referred to as port P3, and the ballasting port 218 may be referred to as port P4. Each of the ports is understood to have a characteristic impedance of 50 Ohm for standard matching of components.

Input port 212, output port 214, coupled port 216 and ballasting port 218 depicted in FIG. 2 may be similar to input port 12, output port 14, coupled port 16 and ballasting port 18, respectively, depicted in FIG. 1. Coupler 200 includes two sets of coupled inductors (also called coils)—primary coils 252, which include a first transmission element 222 and a second transmission element 224 and secondary coils 254 which include the third transmission element 224 and the fourth transmission element 240.

Primary coils 252 include two coupled coils in a primary chain connected in series and secondary coils 254 include two coupled coils in a secondary chain connected in series.

As described above, primary coils 252 are comprised of the first transmission element 222 and the second transmission element 224. The first transmission element 222 and the second transmission element 224 may also be referred to individually as inductors. The first transmission element 222 has a first connection 226 to the input port 212 and a second connection 228 to a first connection 248 of a third transmission element 246. Furthermore, the second transmission element 224 has another first connection 230 to the coupled port 216 and another second connection 232 to a first connection 238 of a fourth transmission element 240.

The directional coupler 200 includes a first compensation capacitor 234 that is connected to the input port 212 and the coupled port 216, in addition to a second compensation capacitor 236 that is connected to the input port 212 and the ballasting port 218.

As described above, secondary coils 254 are comprised of the third transmission element 224 and the fourth transmission element 240. The third transmission element 224 and the fourth transmission element 240 may also be referred to individually as inductors. The third transmission element 246 has a first connection 248 to the second 228 connection of the first transmission element 222 and a second connection 244 to the output port 214. Furthermore, the fourth transmission element 240 has another first connection 238 to the first connection 242 of the second transmission element 224 and a second connection 242 to the ballasting port 218.

Coupler 200 may create large coupling between two primary coils and one of the secondary coils. Another secondary coil may have a "regular" coupling with one of the primary coils while additional coupling with second primary coil.

Coupler 200 may provide a substantially higher level of coupling between primary and secondary coils for the same footprint area as compared to coupler 10 in FIG. 1. In an implementation, for the same coupling coefficient as coupler 10, coupler 200 has a shorter geometrical length of coupled metal coil traces which results in decreased loss.

FIG. 3 is a schematic diagram illustrating a prior art directional coupler 300 that includes various component values. Coupler 300 has an input port 312, an output port 314, a coupled port 316, and a ballasting port 318. As described above, for a directional coupler in the general case, a portion of the signal that is applied to the input port 312 is passed through to the output port 314, and another portion of the same is passed to the coupled port 316. Although in an ideal case, the signal is not passed to the ballasting port 318, in a typical implementation, at least a minimal signal level is present. For purposes of discussing and graphically illustrating the scattering parameters (S-Parameters) of the four-port device that is the directional coupler 300, the input port 312 may be referred to as port P1, the output port 314 may be referred to as port P2, the coupled port 316 may be referred to as port P3, and the ballasting port 318 may be referred to as port P4. Each of the ports is understood to have a characteristic impedance of 50 Ohm for standard matching of components.

Notwithstanding the foregoing naming conventions of the various ports of the directional coupler, it is possible to apply a signal to the port P3 (coupled port 316) that is passed to port P4 (ballasting port 318), with a portion thereof being passed to the port P1 (input port 312) and minimized at the port P2 (output port 314). In other words, the ports P1 and P2 are functionally reciprocal with the ports P3 and P4. It is understood, however, that directivity may be different between when the signal is applied to port P1 versus when the signal is applied to port P2. Although not entirely symmetric, in both cases there is contemplated to be sufficient directivity for most applications. Along these lines, the port P2 can be utilized as the input port while port P1 can be utilized as the output port. According to such use, it follows that the port P4 is the coupled port and the port P3 is the ballasting port. Another configuration where the port P4 is utilized as the input port, then the output port will be the port P3, while the port P2 will be the coupled port and the port P1 will be the ballasting port. The loss between port P1 and port P2, and the loss between port P3 and port P4 may be different if the widths and thicknesses of the conductive traces of the directional coupler 300, discussed in greater detail below, are different.

The directional coupler 300 further includes coupled inductors 320 that include a first transmission element 322 and a second transmission element 324. The first transmission element 322 and the second transmission element 324 may also be referred to individually as inductors. The first transmission element 322 has a first connection 326 to the input port 12 and a second connection 328 to the output port 314. Furthermore, the second transmission element 324 has another first connection 330 to the coupled port 316 and another second connection 332 to the ballasting port 318. As depicted, the first transmission element 322 or inductor, as well as the second transmission element 324 or inductor, have exemplary inductance values of 0.25 nH, and an exemplary resistance of 0.5 Ohm.

The directional coupler 300 includes a first compensation capacitor 334 that is connected to the input port 312 and the coupled port 316, in addition to a second compensation capacitor 336 that is connected to the input port 312 and the ballasting port 318. As depicted, the first compensation capacitor 334 may have a capacitance value of 0.041 pF, while the second compensation capacitor 336 may have a capacitance value of 0.029 pF.

In FIG. 3, the two compensation capacitors may be used while inductor values for the primary coil (the first transmission element 322) and the secondary coil (the second transmission element 324) are identical, or close to each other.

In FIG. 2, compensation capacitors may be used while primary coils 252 and secondary coils 254 are at least two or more transmission elements. In an implementation, values for the primary coils and secondary coils are identical or close to each other which substantially increases the coupling coefficient between input port and coupled port for the same coupler footprint area compared to coupler 300 in FIG. 3.

In an implementation, a directional coupler may include a first port, a second port, a third port, a fourth port, inductors, and capacitors. The first port may be referred to an input port. The second port may be referred to an output port. The third port may be referred to a coupled port. The fourth port may be referred to a ballasting port. For the purpose of describing of the figures, a first port, a second port, a third port, and a fourth port will be referred to an input port, an output port, a coupled port, and a ballasting port hereafter.

Figure 4:
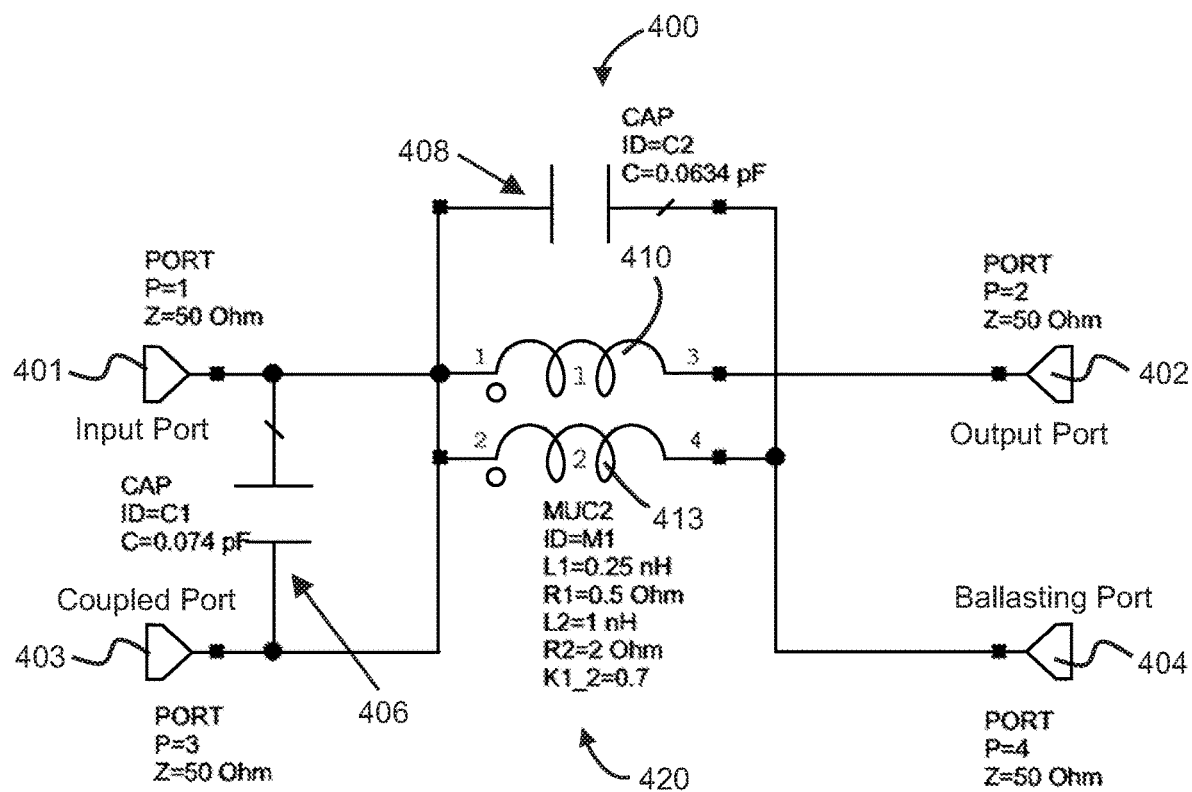
FIG. 4 is a schematic diagram illustrating a first embodiment of a directional coupler in accordance with the present invention.

FIG. 4 is a schematic diagram illustrating a directional coupler 400. The depicted implementation includes an input port 401, an output port 402, a coupled port 403, and a ballasting port 404. The ballasting port 404 may also be called as an isolated port. For a directional coupler in a general case, a portion of the signal that is applied to the input port 401 is passed through to the output port 402, and another portion of the same is passed to the coupled port 403. Although in an ideal case, the signal is not passed to the ballasting port 404, in a typical implementation, at least a minimal signal level is present. For purposes of discussing and graphically illustrating the scattering parameters (S-Parameters) of the four-port device that is the directional coupler 400, the input port 401 may be referred to as port P1, the output port 402 may be referred to as port P2, the coupled port 403 may be referred to as port P3, and the ballasting port 404 may be referred to as port P4. Each of the ports is understood to have a characteristic impedance of 50 Ohm for standard matching of components.

Notwithstanding the foregoing naming conventions of the various ports of the directional coupler, it is possible to apply a signal to the port P3 (coupled port 403) that is passed to port P4 (ballasting port 404), with a portion thereof being passed to the port P1 (input port 401) and minimized at the port P2 (output port 402). In other words, the ports P1 and P2 are functionally reciprocal with the ports P3 and P4. It is understood, however, that directivity may be different between when the signal is applied to port P1 versus when the signal is applied to port P2. Although not entirely symmetric, in both cases there is contemplated to be sufficient directivity for most applications. Along these lines, the port P2 can be utilized as the input port while port P1 can be utilized as the output port. According to such use, it follows that the port P4 is the coupled port and the port P3 is the ballasting port Another configuration where the port P4 is utilized as the input port, then the output port will be the port P3, while the port P2 will be the coupled port and the port P1 will be the ballasting port.

The directional coupler 400 may further include coupled inductors 420 that include a first inductor 410 and a second inductor 413. Additional details pertaining to the physical implementation of such inductors and how they are inductively coupled will be discussed more fully below. The first inductor 410 has a first connection to the input port 401 and a second connection to the output port 402. Furthermore, the second inductor 413 has another first connection to the coupled port 403 and another second connection to the ballasting port 404.

In an implementation, an inductance of the second inductor 413 is substantially greater than an inductance of the first inductor 410 while maintaining a similar coupling coefficient between inductors as in prior art. An inductance of the second inductor 413 may be at least two times or higher than an inductance of the first inductor 410. For example, the first inductor 410 has an inductance of 0.25 nH and a resistance of 0.5 Ohm. The second inductor 413 has an inductance of 1 nH and a resistance of 2 Ohm. A magnetic coupling coefficient between the first inductor 410 and the second inductor 413 is 0.7. The inductance of the second inductor 412 is four times greater than the inductance of the first inductor 410. Low inductance of the first inductor may result in decreased metal losses in direct chain between the input port 401 and the output port 402.

The directional coupler 400 may include a first compensation capacitor 406 that is connected to the input port 401 and the coupled port 403, in addition to a second compensation capacitor 408 that is connected to the input port 401 and the ballasting port 404. In an implementation, the magnitude of the first compensation capacitor 406 may be substantially similar to the magnitude of the capacitance of the second capacitor 408. For example, the first compensation capacitor 406 has a capacitance of 0.074 pF, whereas the second compensation capacitor 408 has a capacitance of 0.0634 pF.

In an implementation, the directional coupler 400 may further comprise a third compensation capacitor and a fourth compensation capacitor, wherein a capacitance of the third compensation capacitor is four to five times lower than a capacitance of the first compensation capacitor 406 and a capacitance of the fourth capacitor is three to four times greater than a capacitance of the second compensation capacitor 408.

In an implementation, the directional coupler 400 may also further comprise a fifth compensation capacitor and a sixth compensation capacitor, wherein a capacitance of the fifth compensation capacitor is approximately ten times higher than a capacitance of the sixth compensation capacitor and a capacitance of the sixth compensation capacitor is four to five times lower than a capacitance of the first compensation capacitor 406.

Figure 5:
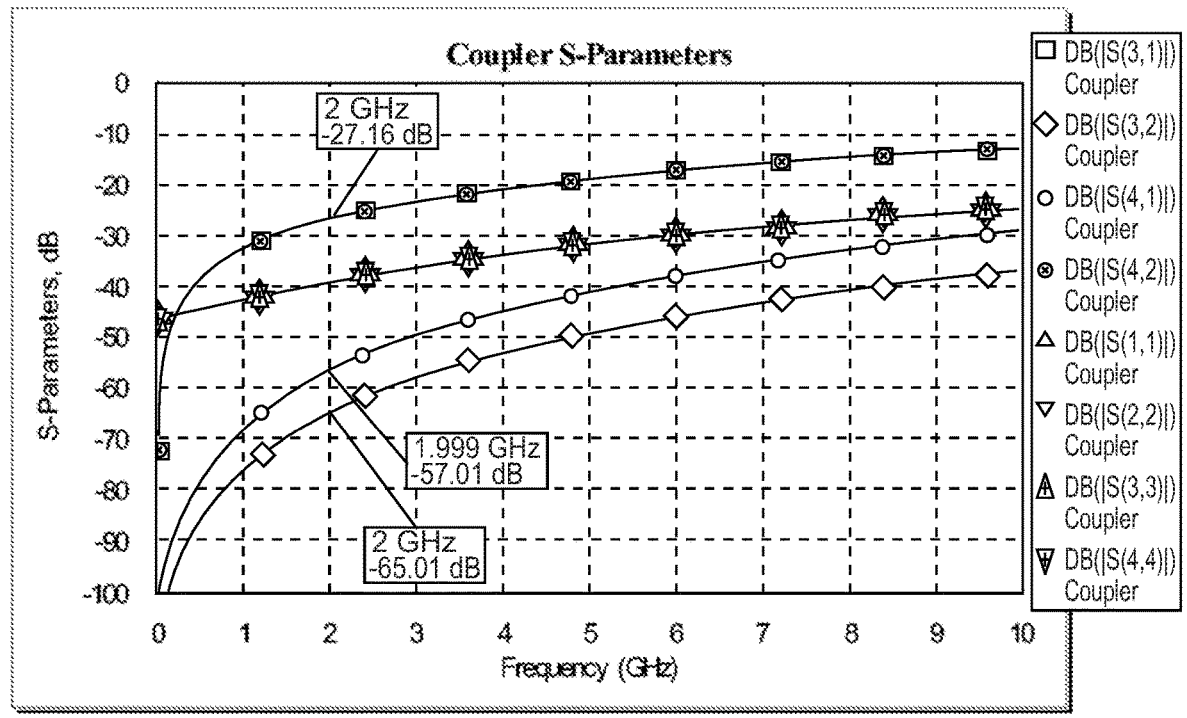
FIG. 5 is a graph showing the scattering parameters (S-parameters) of the prior art directional coupler over an operating frequency range, with the coupling factor, first and second isolation factors, and return losses being detailed.

FIG. 5 is a graph showing the scattering parameters (S-parameters) 500 of the prior art directional coupler in FIG. 3 over an operating frequency range, with the coupling factor, first and second isolation factors, and return losses. The compensation capacitors' values have been tuned to get highest isolation at 2 GHz. An isolation value is dependent on excitation port.

Figure 6:
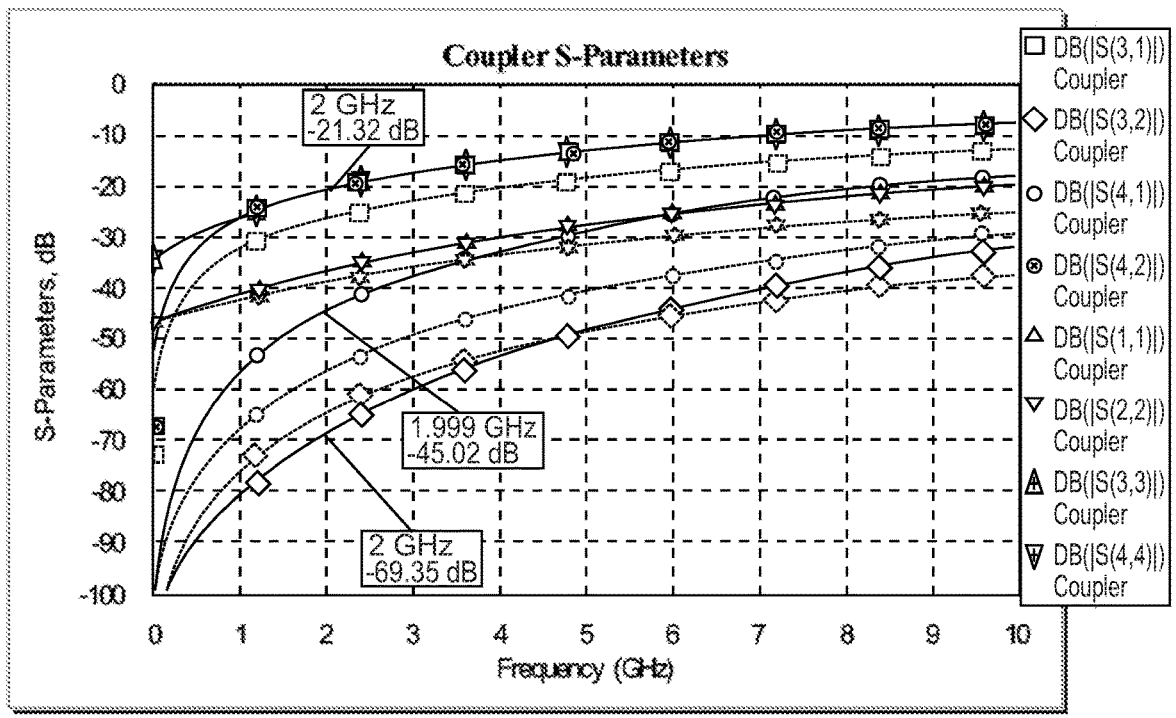
FIG. 6 is a graph showing the scattering parameters (S-parameters) of the directional coupler shown in FIG. 4 over an operating frequency range, with the coupling factor, first and second isolation factors, and return losses being detailed.

FIG. 6 is a graph showing the scattering parameters (S-parameters) 600 of the directional coupler 400 shown in FIG. 4 over an operating frequency range, with the coupling factor, first and second isolation factors, and return losses.

With reference to the graph of FIG. 5 and FIG. 6, given the four-port configuration of the directional coupler, the electrical behavior thereof in response to a steady-state input can be described by a set of scattering parameters (S-parameters). Each of the plots of the graphs shown in FIG. 5 is a simulated result of prior art that focuses on getting the highest isolation at 2 GHz via adjustment of compensation capacitors' capacitance. Each of the plots of the graphs shown in FIG. 6 is a simulated result of an implementation of the present disclosure described in FIG. 4. FIG. 5 and FIG. 6 each include a first plot describing a coupling factor and a second plot describing a first isolation factor.

In an implementation, referring to FIG. 4, as pertinent to the operational characteristics of the directional coupler 400, the first inductor 410 and the second inductor 413 may be characterized by a predefined coupling factor, that is, the degree to which the signal on the first inductor 410 is passed or coupled to the second inductor 413. The coupling factor corresponds to S31, or the gain coefficient between the input port 401 (P1) and the coupled port 403 (P3). Additionally, the coupled inductors of the first inductor 410 and the second inductor 413 are also characterized by a predefined first isolation factor between the first connection of the first inductor 410 and the second connection of the second inductor 413, that is, between the input port 401 and the coupled port 403. The first isolation factor corresponds to S32 and is the gain coefficient between the output port 402 (P2) and the coupled port 403 (P3). The coupled inductors of the first inductor 410 and the second inductor 413 are further characterized by a predefined second isolation factor between the first connection of the first inductor 410 and the second connection of the second inductor 413. More generally, this refers to the degree of isolation between the input port 401 and the ballasting port 404. The predefined second isolation factor corresponds to S41 and is the gain coefficient between the input port 401 (P1) and the ballasting port 404 (P4). The remainder of the plots of the graph are shown in FIG. 5.

FIG. 6 includes a third plot describing the input port 401 reflection coefficient S11, a fourth plot describing the output port 402 reflection coefficient S22, a fifth plot describing the coupled port 403 reflection coefficient S33, a sixth plot describing the ballasting port 404 reflection coefficient S44, a seventh plot describing the output port 402—ballasting port 404 gain (coupling) coefficient S42, and an eighth plot describing the coupling port 403—ballasting port 404 gain coefficient S43.

In an implementation, a first directivity defined by the predefined coupling factor and the first isolation factor is different from a second directivity defined by the predefined coupling factor and the second isolation factor.

Referring to FIG. 6, increasing the inductance of the second inductor to four times of the inductance of the first inductor and keeping the same magnetic coupling coefficient between the first inductor 410 and the second inductor 413 results in a 6 dB increased coupling between the input port 401 and the coupled port 403.

Figure 7:
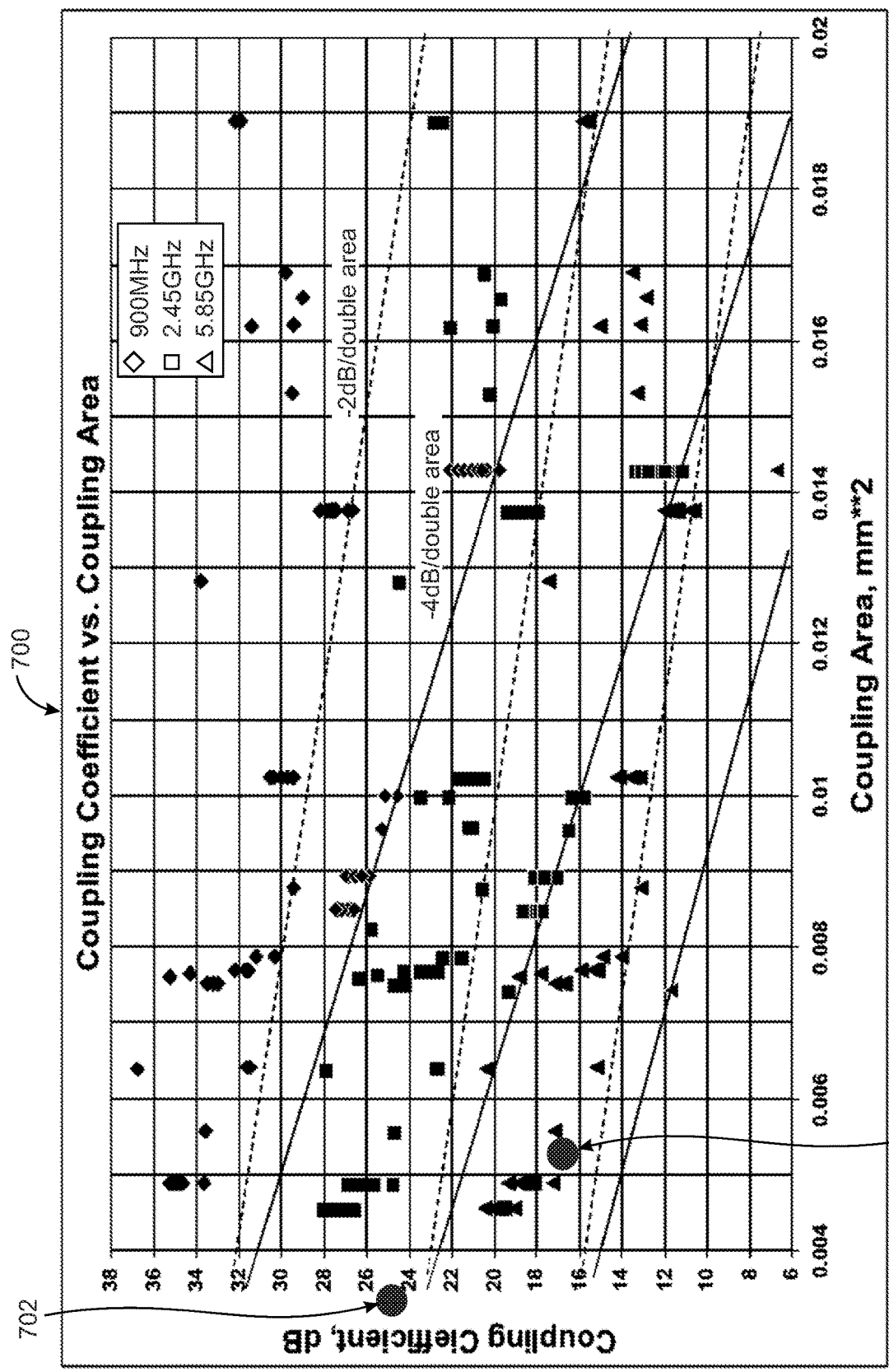
FIG. 7 is a graph showing the coupling coefficient of various embodiments of a directional coupler, in accordance with the present disclosure over a coupling area.

FIG. 7 is a graph 700 showing the coupling coefficient of various embodiments of a directional coupler in accordance with the present disclosure and prior art presented in FIG. 3 over a coupling area. Simulation results of different directional coupler structures such as a different size, number of stubs, etc., are shown as respective plots of graph in FIG. 7. Three different frequency bands for structures are presented in FIG. 7 with highest coupling coefficient case approximated by dashed straight lines. A first point 702 is a result of an implementation that is described in FIG. 15. A second point 704 is a result of another implementation that is described in FIG. 21 and FIG. 29.

Figure 9:
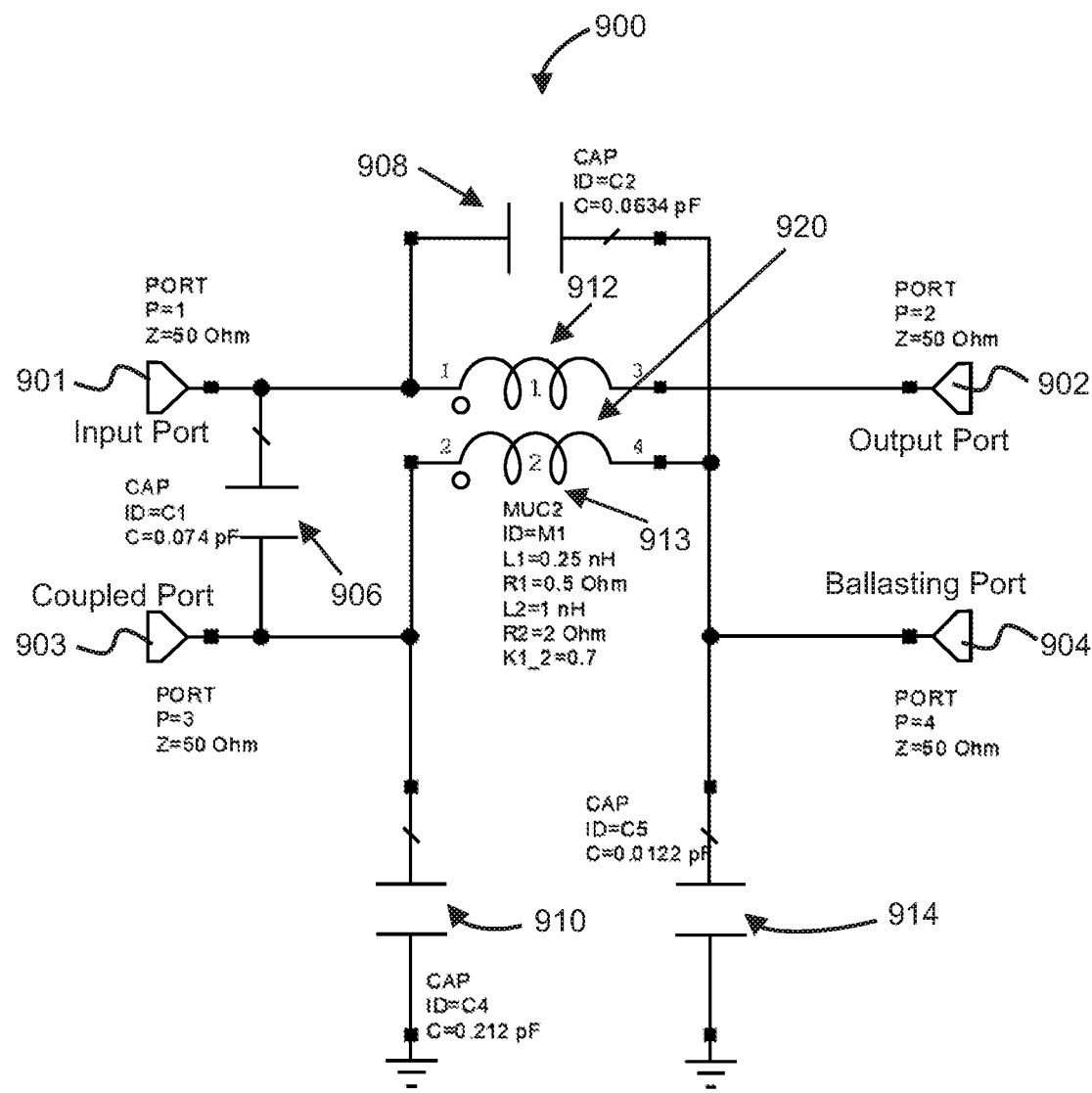
FIG. 9 is a schematic diagram illustrating a third embodiment of a directional coupler, in accordance with another implementation of the disclosure.
Figure 10:
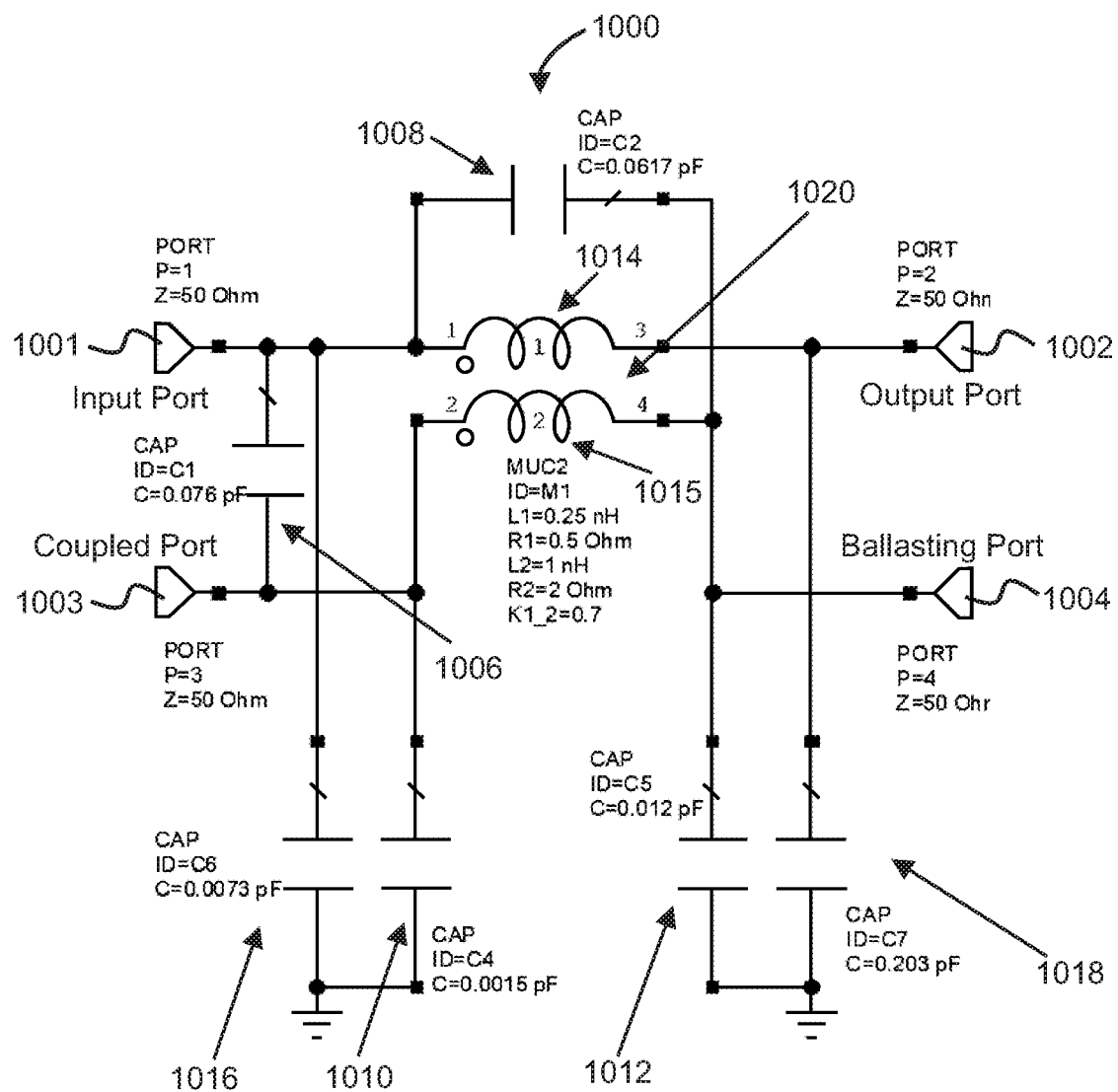
FIG. 10 is a schematic diagram illustrating a fourth embodiment of a directional coupler, in accordance with another implementation of the disclosure.

All known prior art systems utilize coupling between inductors as well as compensation capacitors associated with the inductors. However, in real world applications, there is always an electrical ground plane. Different variations of implementations of the present disclosure, which utilize ground in addition to compensation capacitors between inductors, are shown in FIG. 8, FIG. 9, and FIG. 10.

Figure 8:
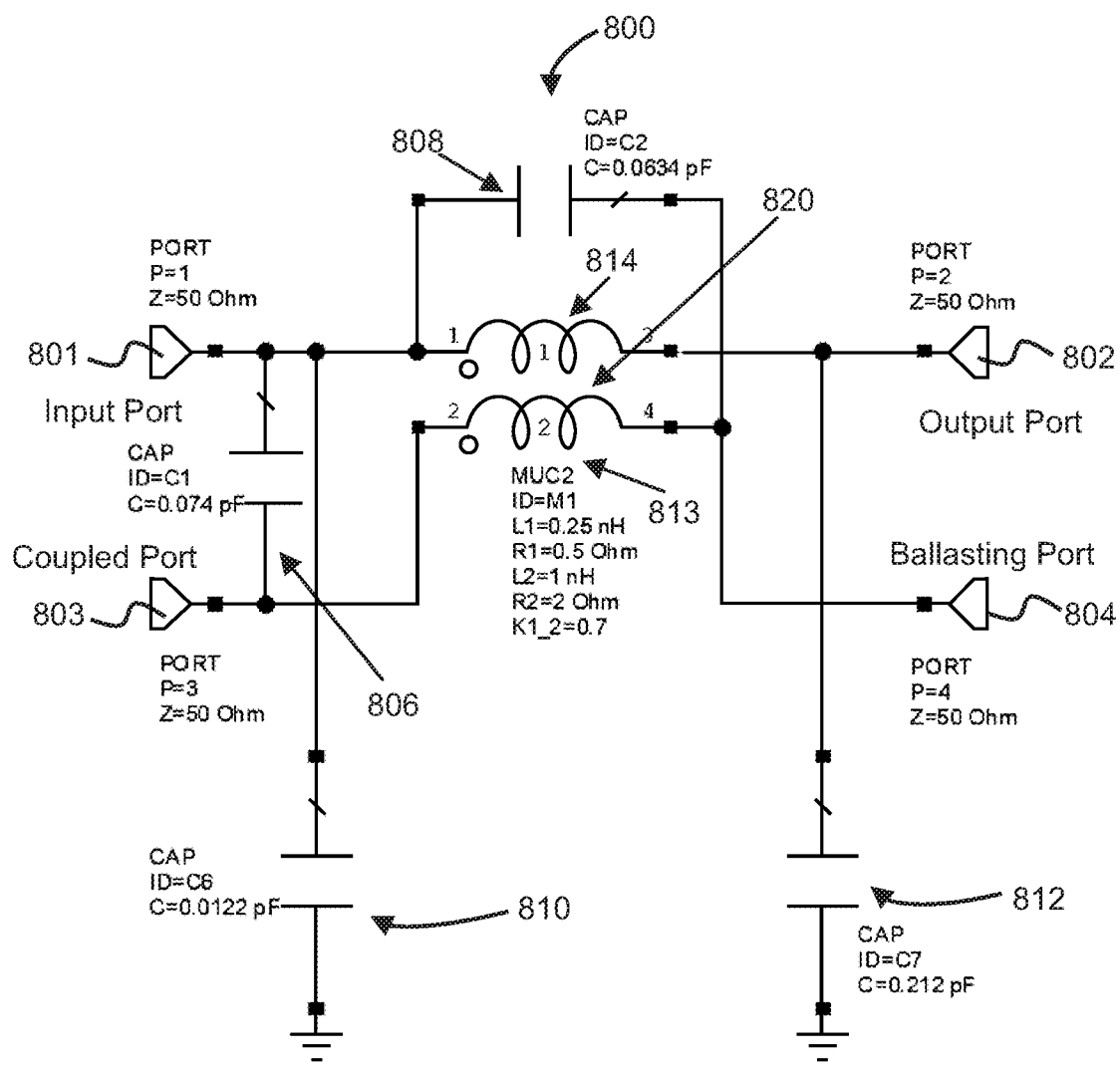
FIG. 8 is a schematic diagram illustrating a second embodiment of a directional coupler, in accordance with another implementation of the disclosure.

FIG. 8 is a schematic diagram illustrating a directional coupler 800. The directional coupler 800 is in many respects similar to the directional coupler 400 of FIG. 4. This variant likewise includes an input port 801, an output port 802, a coupled port 803, and a ballasting port 804. Functionally, a portion of the signal that is applied to the input port 801 is passed through to the output port 802, and another portion of the same is passed to the coupled port 803. A minimal signal level is present on the ballasting port 804. For purposes of discussing and graphically illustrating the scattering parameters (S-Parameters), in similar fashion as the directional coupler 400 in FIG. 4, the input port 801 may be referred to as port P1, the output port 802 may be referred to as port P2, the coupled port 803 may be referred to as port P3, and the ballasting port 804 may be referred to as port P4. Each of the ports is understood to have a characteristic impedance of 50 Ohm for standard matching of components.

The directional coupler 800 includes the first inductor 814 and the second inductor 813. The first inductor 814 has a first connection to the input port 801 and a second connection to the output port 802. The second inductor 813 has another first connection to the coupled port 803 and another second connection to the ballasting port 804. An inductance of the second inductor 813 is substantially greater than an inductance of the first inductor 814. For example, the first inductor 814 has an inductance of 0.25 nH and a resistance of 0.5 Ohm. The second inductor 813 has an inductance of 1 nH and a resistance of 2 Ohm. A magnetic coupling coefficient between the first inductor 814 and the second inductor 813 is 0.7.

Like the directional coupler 400 of FIG. 4, the directional coupler 800 of FIG. 8 includes a first compensation capacitor 806 that is connected to the input port 801 and the coupled port 803, in addition to a second compensation capacitor 808 that is connected to the input port 801 and the ballasting port 804. The directional coupler 800 further includes a third compensation capacitor 810 that is connected to the input port 801 and a first node, in addition to a fourth compensation capacitor 812 that is connected to the output port 802 and a second node. In an implementation, the first and second node each comprise a ground node. A capacitance of the third compensation capacitor 810 and a capacitance of the fourth compensation capacitor 812 are chosen to get highest level of isolation between main signal chain and coupled chain. A capacitance of the third compensation capacitor 810 is approximately ten times lower than a capacitance of the fourth compensation capacitor 812. A capacitance of the third compensation capacitor 810 is approximately twice higher than a capacitance of the first compensation capacitor 806. A capacitance of the fourth compensation capacitor 812 is approximately three to four times higher than a capacitance of the second compensation capacitor 808. For example, the first compensation capacitor may have a capacitance of 0.074 pF, while the second compensation capacitor may have a capacitance of 0.0634 pF. The third compensation capacitor 810 may have a capacitance of 0.0122 pF, while the fourth compensation capacitor 812 may have a capacitance of 0.212 pF.

In an implementation, a magnitude of a capacitance of the third compensation capacitor 810 is ten times lower than a magnitude of a capacitance of the fourth compensation capacitor 812.

FIG. 9 is a schematic diagram illustrating a directional coupler 800. The directional coupler 900 is in many respects similar to the directional coupler 400 of FIG. 4 and the directional coupler 800 of FIG. 8. This variant likewise includes an input port 901, an output port 902, a coupled port 903, and a ballasting port 904. Functionally, a portion of the signal that is applied to the input port 901 is passed through to the output port 902, and another portion of the same is passed to the coupled port 903. A minimal signal level is present on the ballasting port 904. For purposes of discussing and graphically illustrating the scattering parameters (S Parameters), in similar fashion as the directional coupler 400 in FIG. 4, the input port 901 may be referred to as port P1, the output port 902 may be referred to as port P2, the coupled port 903 may be referred to as port P3, and the ballasting port 904 may be referred to as port P4. Each of the ports is understood to have a characteristic impedance of 50 Ohm for standard matching of components.

The directional coupler 900 includes the first inductor 912 and the second inductor 913, The first inductor 912 has a first connection to the input port 901 and a second connection to the output port 902. The second inductor 913 has another first connection to the coupled port 903 and another second connection to the ballasting port 904. An inductance of the second inductor 913 is substantially greater than an inductance of the first inductor 912. For example, the first inductor 912 has an inductance of 0.25 nH and a resistance of 0.5 Ohm. The second inductor 813 has an inductance of 1 nH and a resistance of 2 Ohm. A magnetic coupling coefficient between the first inductor 912 and the second inductor 913 is 0.7.

Like the directional coupler 400 of FIG. 4, the directional coupler 900 includes a first compensation capacitor 906 that is connected to the input port 901 and the coupled port 903, in addition to a second compensation capacitor 908 that is connected to the input port 901 and the ballasting port 904. The directional coupler 900 further includes a fifth compensation capacitor 910 that is connected to the coupled port 903 and a first node, in addition to a sixth compensation capacitor 914 that is connected to the ballasting port 904 and a second node. In an implementation, the first and second node each comprise a ground node. A capacitance of the fifth compensation capacitor 910 and a capacitance of the sixth compensation capacitor 914 are chosen to get the highest level of isolation between the main signal chain and the coupled chain. A capacitance of the fifth compensation capacitor 910 is approximately ten times higher than a capacitance of the sixth compensation capacitor 914. A capacitance of the sixth compensation capacitor 914 is approximately twice higher than a capacitance of the first compensation capacitor 906. A capacitance of the fifth compensation capacitor 910 is approximately three to four times higher than a capacitance of the second compensation capacitor 908. For example, the first compensation capacitor may have a capacitance of 0.074 pF, while the second compensation capacitor may have a capacitance of 0.0634 pF. The fifth compensation capacitor 910 may have a capacitance of 0.212 pF, while the sixth compensation capacitor 914 may have a capacitance of 0.0122 pF.

FIG. 10 is a schematic diagram illustrating a directional coupler 1000. The directional coupler 1000 is in many respects similar to the directional coupler 400 of FIG. 4, the directional coupler 800 of FIG. 8, and the directional coupler 900 of FIG. 9. This variant likewise includes an input port 1001, an output port 1002, a coupled port 1003, and a ballasting port 1004. Functionally, a portion of the signal that is applied to the input port 1001 is passed through to the output port 1002, and another portion of the same is passed to the coupled port 1003. A minimal signal level is present on the ballasting port 1004. For purposes of discussing and graphically illustrating the scattering parameters (S-Parameters), in similar fashion as the directional coupler 400 in FIG. 4, the input port 1001 may be referred to as port P1, the output port 1002 may be referred to as port P2, the coupled port 1003 may be referred to as port P3, and the ballasting port 1004 may be referred to as port P4. Each of the ports is understood to have a characteristic impedance of 50 Ohm for standard matching of components.

The directional coupler 1000 includes the first inductor 1014 and the second inductor 1015, The first inductor 1014 has a first connection to the input port 1001 and a second connection to the output port 1002. The second inductor 1015 has another first connection to the coupled port 1003 and another second connection to the ballasting port 1004. An inductance of the second inductor 1015 is substantially greater than an inductance of the first inductor 1014. For example, the first inductor 1014 has an inductance of 0.25 nH and a resistance of 0.5 Ohm. The second inductor 1015 has an inductance of 1 nH and a resistance of 2 Ohm. A magnetic coupling coefficient between the first inductor 1014 and the second inductor 1015 is 0.7.

The directional coupler 1000 includes a first compensation capacitor 1006 that is connected to the input port 1001 and the coupled port 1003, in addition to a second compensation capacitor 1008 that is connected to the input port 1001 and the ballasting port 1004. The directional coupler 1000 further includes a third compensation capacitor 1016 that is connected to the input port 1001 and a first node, a fourth compensation capacitor 1018 that is connected to the output port 1002 and a second node, a fifth compensation capacitor 1010 that is connected to the coupled port 1003 and the first node, in addition to a sixth compensation capacitor 1012 that is connected to the ballasting port 1004 and the second node. In an implementation, the first and second node each comprise a ground node.

Capacitances of all compensation capacitors are slightly changed from implementations described above to get highest level of isolation at particular frequencies. A capacitance of the third compensation capacitor 1016 is approximately ten times lower than a capacitance of the first compensation capacitor 1006. A capacitance of the fifth compensation capacitor 1010 is approximately three to four times lower than a capacitance of the third compensation capacitor 1016. A capacitance of the sixth compensation capacitor 1012 is approximately twice higher than a capacitance of the second compensation capacitor 1008. A capacitance of the fourth compensation capacitor 1018 is approximately three to four times higher than a capacitance of the second compensation capacitor 1008. The fourth compensation capacitor 1018 has the highest capacitance of all compensation capacitors. For example, the first compensation capacitor 1006 may have a capacitance of 0.076 pF, the second compensation capacitor 1008 may have a capacitance of 0.0617 pF, the third compensation capacitor 1016 may have a capacitance of 0.0073 pF, the fourth compensation capacitor 1018 may have a capacitance of 0.203 pF, and the fifth compensation capacitor 1010 may have a capacitance of 0.0015 pF, while the sixth compensation capacitor 1012 may have a capacitance of 0.012 pF.

Figure 12:
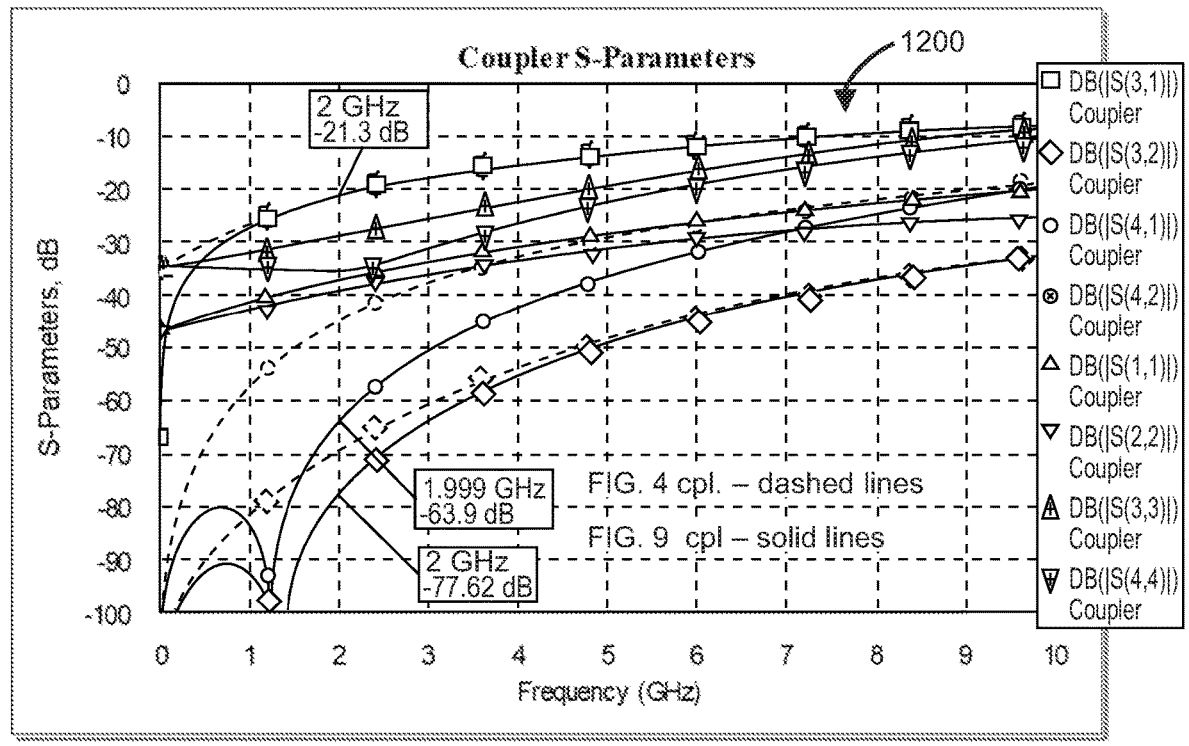
FIG. 12 is a graph showing the scattering parameters (S-parameters) of the directional couplers shown in FIG. 4 (shaded lines) and FIG. 9 (bold lines) over an operating frequency range, with the coupling factor, first and second isolation factors, and return losses being detailed.
Figure 13:
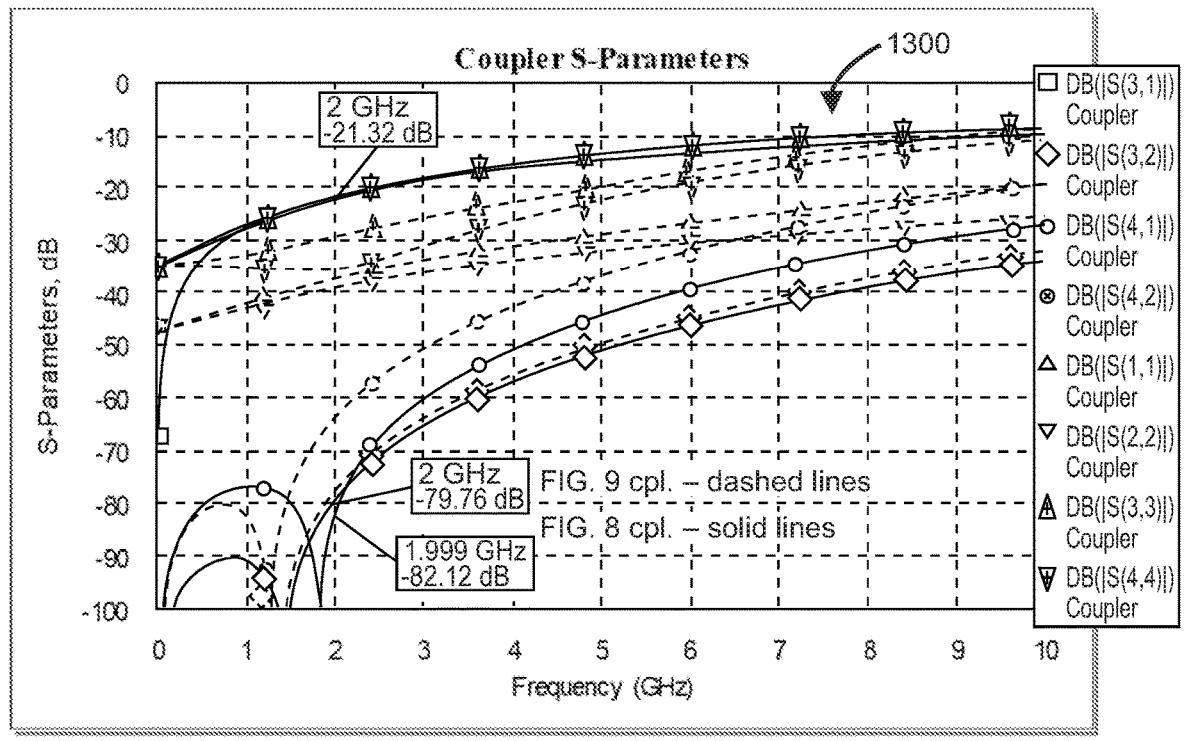
FIG. 13 is a graph showing the scattering parameters (S-parameters) of the directional couplers shown in FIG. 8 (bold lines) and FIG. 9 (shaded lines) over an operating frequency range, with the coupling factor, first and second isolation factors, and return losses being detailed.
Figure 14:
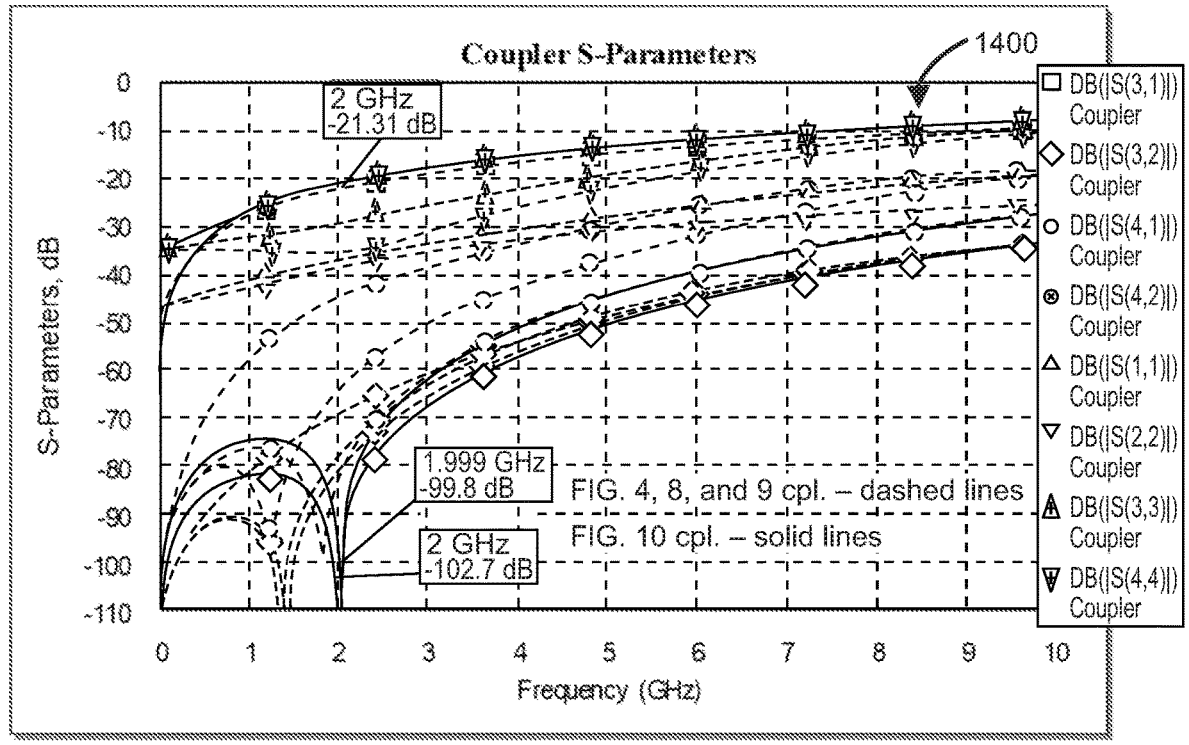
FIG. 14 is a graph showing the scattering parameters (S-parameters) of the directional couplers shown in FIG. 4, FIG. 8, FIG. 9 (shaded lines), and FIG. 10 (bold lines) over an operating frequency range, with the coupling factor, first and second isolation factors, and return losses being detailed.

With reference to the graph of FIG. 11, FIG. 12, FIG. 13 and FIG. 14, given the four-port configuration of the directional coupler, the electrical behavior thereof in response to a steady-state input can be described by a set of scattering parameters (S-parameters). Plots of graph shown in FIG. 11, FIG. 12, FIG. 13, and, and FIG. 14 are simulated results that focus on getting the highest isolation at 2 GHz via adjustment of compensation capacitors' capacitances.

Figure 11:
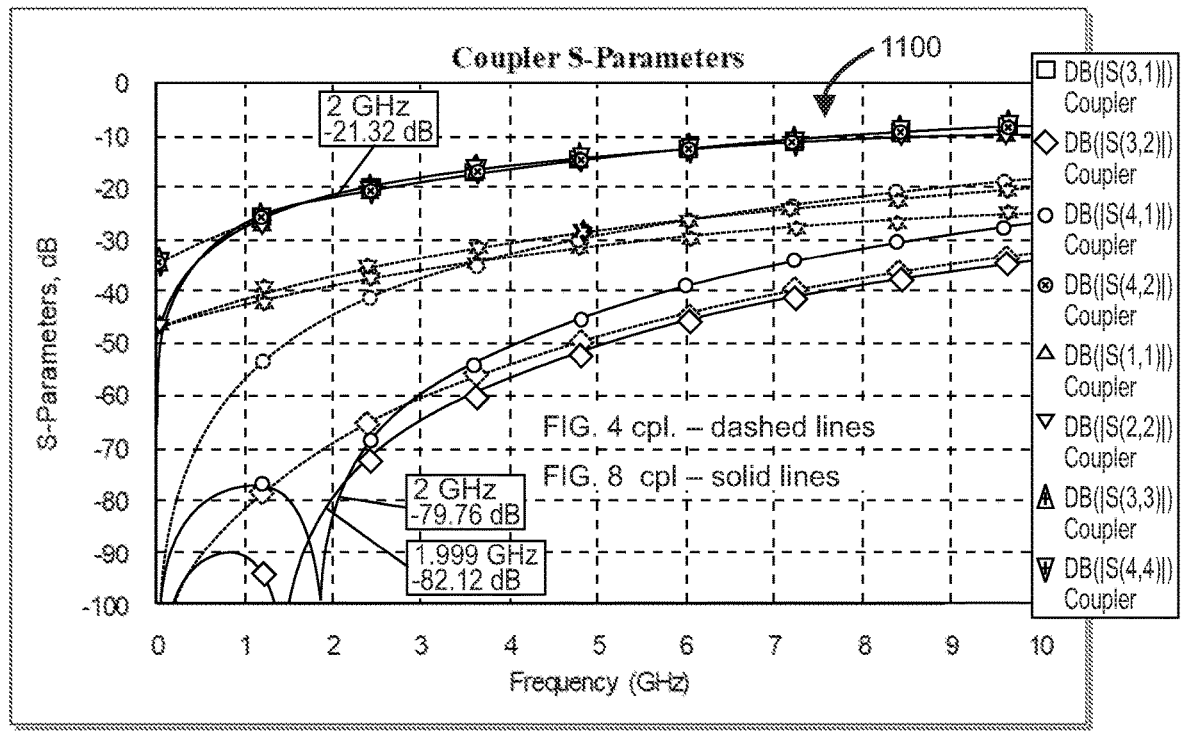
FIG. 11 is a graph showing the scattering parameters (S-parameters) of the directional couplers (labeled "cpl.") shown in FIG. 4 (shaded lines) and FIG. 8 (bold lines) over an operating frequency range, with the coupling factor, first and second isolation factors, and return losses being detailed.

FIG. 11 is a graph showing the scattering parameters (S-parameters) 1100 of the directional couplers shown in FIG. 4 (shaded lines) and FIG. 8 (bold lines) over an operating frequency range, with the coupling factor, first and second isolation factors, and return losses being detailed.

FIG. 12 is a graph showing the scattering parameters (S-parameters) 1200 of the directional couplers shown in FIG. 4 (shaded lines) and FIG. 9 (bold lines) over an operating frequency range, with the coupling factor, first and second isolation factors, and return losses being detailed.

FIG. 13 is a graph showing the scattering parameters (S-parameters) 1300 of the directional couplers shown in FIG. 8 (bold lines) and FIG. 9 (shaded lines) over an operating frequency range, with the coupling factor, first and second isolation factors, and return losses being detailed.

FIG. 14 is a graph showing the scattering parameters (S-parameters) 1400 of the directional couplers shown in FIG. 4, FIG. 8, FIG. 9 (shaded lines), and FIG. 10 (bold lines) over an operating frequency range, with the coupling factor, first and second isolation factors, and return losses.

Below descriptions may all be applied to FIG. 11, FIG. 12, FIG. 13, and FIG. 14. In a graph, a first plot is describing a coupling factor and a second plot is describing a first isolation factor. Similar to the implementation of the directional coupler 400 of FIG. 4, as pertinent to the operational characteristics of a directional coupler, a first inductor and a second inductor may be characterized by a predefined coupling factor; that is, the degree to which the signal on the first inductor is passed or coupled to the second inductor. The coupling factor corresponds to S31, or the gain coefficient between an input port (P1) and a coupled port (P3). Additionally, the coupled inductors of the first inductor and the second inductor are also characterized by a predefined first isolation factor between a first connection of the first inductor and a second connection of the second inductor; that is, between the input port and the coupled port. The first isolation factor corresponds to S32 and is the gain coefficient between an output port (P2) and the coupled port (P3). The coupled inductors of the first inductor and the second inductor are further characterized by a predefined second isolation factor between the first connection of the first inductor and the second connection of the second inductor. More generally, this refers to the degree of isolation between the input port and a ballasting port. The predefined second isolation factor corresponds to S41 and is the gain coefficient between the input port (P1) and the ballasting port (P4). The remainder of the plots of the graph include a third plot describing the input port reflection coefficient S11, a fourth plot describing the output port reflection coefficient S22, a fifth plot describing the coupled port reflection coefficient S33, a sixth plot describing the ballasting port reflection coefficient S44, a seventh plot describing the output port—ballasting port gain (coupling) coefficient S42, and an eighth plot describing the coupling port—ballasting port gain coefficient S43.

Referring now to FIG. 11, the coupling S31 and S42 remain the same as the simulation result of the implementation of the directional coupler 400 of FIG. 4. The isolation S41 is increased by at least 35 dB and S32 is increased by at least 10 dB at 2 GHz for the implementation of the directional coupler 800 of FIG. 8 compared to the implementation of the directional coupler 400 of FIG. 4. Return losses in the main signal chain S11 and S22 are increased significantly for the implementation of the directional coupler 800 of FIG. 8 compared to the implementation of the directional coupler 400 of FIG. 4. However, the return loss in the main signal chain may still well be suited for the most of applications.

Referring now to FIG. 12, the coupling S31 and S42 remain the same as the simulation result of the implementation of the directional coupler 400 of FIG. 4. The isolation S41 is increased by at least 35 dB and S32 is increased by at least 10 dB at 2 GHz for the implementation of the directional coupler 900 of FIG. 9 compared to the implementation of the directional coupler 400 of FIG. 4. Return losses in the main signal chain S11 and S22 have not changed for the implementation of the directional coupler 900 of FIG. 9 compared to the implementation of the directional coupler 400 of FIG. 4. Return losses in coupled chain S33 and S44 are decreased for the implementation of the directional coupler 900 of FIG. 9, which simplifies matching with 50 Ohm circuitry.

Referring now to FIG. 13, the implementation of the directional coupler 800 of FIG. 8 can result in higher isolation at fixed frequency or same isolation for higher frequencies compared to the implementation of the directional coupler 900 of FIG. 9.

Referring now to FIG. 14, the coupling S31 and S42 remain the same as the simulation result of the implementation of the directional coupler 400 of FIG. 4. The isolation S41 is increased by at least 60 dB and S32 is increased by at least 40 dB for the implementation of the directional coupler 1000 of FIG. 10 compared to the implementation of the directional coupler 400 of FIG. 4.

Conductive elements of the implementations of the directional coupler may be disposed on a dielectric layer, which may be a part of semiconductor substrate. Alternative substrate materials such as low temperature co-fired ceramic (LTCC) and thin-film printed substrates are also possible. Those having ordinary skill in the art will recognize that the implementations of the directional couplers may be fabricated on any suitable dielectric material upon which a conductive path may be disposed. Along these lines, the conductive path may be formed of any electrically conductive material such as metal.

Figure 15:
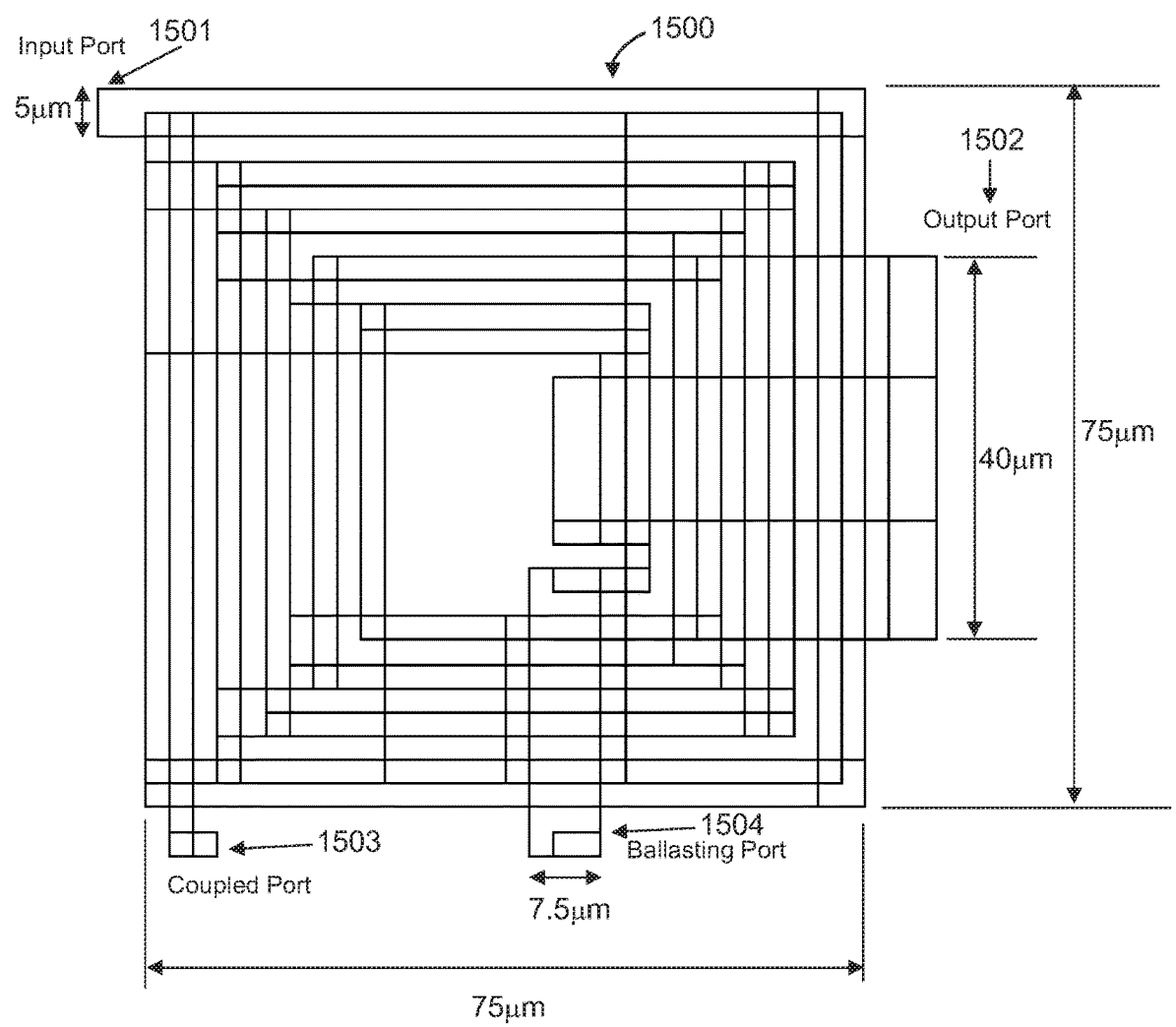
FIG. 15 is a first plan view of the second embodiment of the directional coupler shown in FIG. 8.

FIG. 15 is a plan view 1500 of the directional coupler 800 shown in FIG. 8. An example of an implementation in a silicon semiconductor die for the directional coupler 800 of FIG. 8 is depicted in FIG. 15. Standard layers as in 0.18 µm complementary metal-oxide-semiconductor (CMOS) processes may be used with a ground plane at the bottom side of the die. The directional coupler 800 includes a first spiral conductive trace that corresponds to the schematic-level first inductor 814 of FIG. 8. In this regard, it is intended for the first spiral conductive trace to be dedicated to the main signal path. The first spiral conductive trace has a first outer terminal 1501 that is the schematic-level input port 801 of FIG. 8, a plurality of successive inward turn and an inner terminal that is connected by an underpass to a second outer terminal that is the schematic-level output port 802 of FIG. 8. Although depicted and described in terms of specific perpendicular turn, it will be recognized that the first spiral conductive trace may instead be defined by a plurality of oblique angle turns, or circular turns, or another otherwise spiral configuration. The first spiral conductive trace has 3.5 inward turns. Throughout its entire length, the first spiral conductive trace has a width of 5 µm and a thickness of 4 µm. The first spiral conductive trace is realized in metal layer M4 of the die. The underpass is realized in metal layer M2. A width of the second outer terminal 1502 is 40 µm.

There is also a second spiral conductive trace that corresponds to the second inductor 813 is connected to the coupled port 803 and the ballasting port 804 of FIG. 8. More particularly, the second conductive trace is defined by a first outer terminal 1503 that is connected to the schematic-level coupled port 803 of FIG. 8, a plurality of successive inward turns, and an inner terminal that is connected by an underpass to a second outer terminal 1504 that is connected to the schematic-level ballasting port 804 of FIG. 8. The spacing between any given point on the second spiral conductive trace and the first spiral conductive trace is constant, so the shape and configuration of the second spiral conductive trace is similar to that of the first spiral conductive trace. Accordingly, to the extent that the turns of the first spiral conductive trace is different than the illustrated perpendicular configuration, the turns of the second spiral conductive trace are understood to have such an alternative configuration. The second spiral conductive trace has 4.75 inward turns. Throughout its entire length, the second spiral conductive trace has a width of 2.5 µm and the thickness of 0.5 µm. The second spiral conductive trace is realized in metal layer M3 of the die. It is understood that the second spiral conductive trace is dedicated for the coupled signal path, and accordingly, the signal level is lower, thus only the narrower conductor is utilized. Together with the first spiral conductive trace and the second spiral conductive trace, the overall dimensions in one exemplary implementation is 75 µm by 75 µm. The underpass is realized in metal layer M2. A width of a second outer terminal 1504 is 7.5 µm.

According to another aspect of the present disclosure, the directional coupler 800 may further include one or more conductive circuit elements disposed on the dielectric layer for increasing the capacitive coupling of the first spiral conductive trace to the second spiral conductive trace. In this regard, the fourth compensation capacitor 812 is realized in metal layer M2 and is connected to the output port 802. Distance between the first spiral conductive trace and the second spiral conductive trace as well as their area overlap provides magnetic coupling coefficient between turns.

Figure 16:
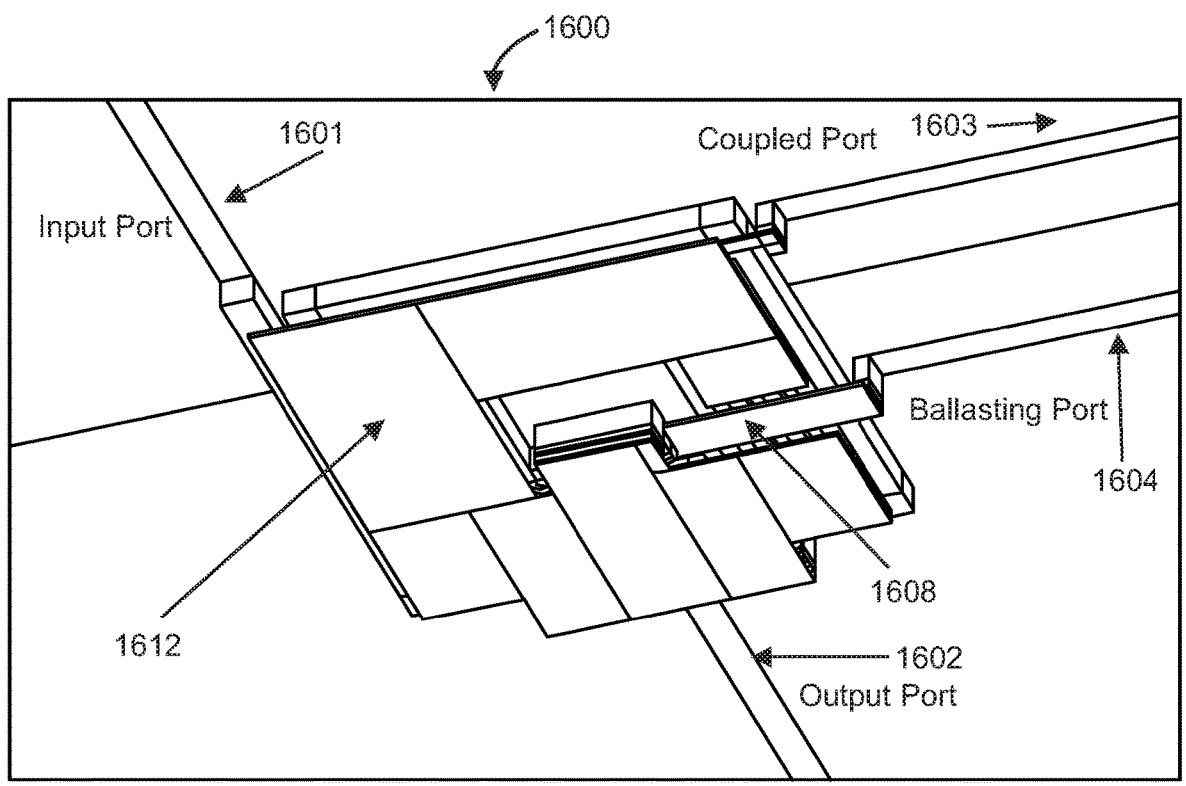
FIG. 16 is a bottom perspective view of an implementation with conductive traces, in accordance with an implementation of the disclosure.

FIG. 16 is a bottom perspective view 1600 of the implementation of FIG. 15 with conductive traces. Like schematic-level depiction, the implementation of the directional coupler 800 of FIG. 8 includes the input port 801 (1601), the output port 802 (1602), the coupled port 803 (1603), and the ballasting port 804 (1604). Each of these ports is understood to be the ends of respective connective traces that may be connection points from another component. The connective traces are shown by way of example only and are generally understood to be a part of the respective ports 1601-1604. Thus, the term "port" may refer to any conductive element that serves as an interface of the directional coupler 800 to outside electrical component connections. An underpass 1608 is used to connect ballasting port and an inner terminal. The fourth compensation capacitor 812 (1612) covers almost an entire area underneath of a coupled chain. This eliminates unexpected coupling of any noise from silicon substrate to coupled chain.

Figure 17:
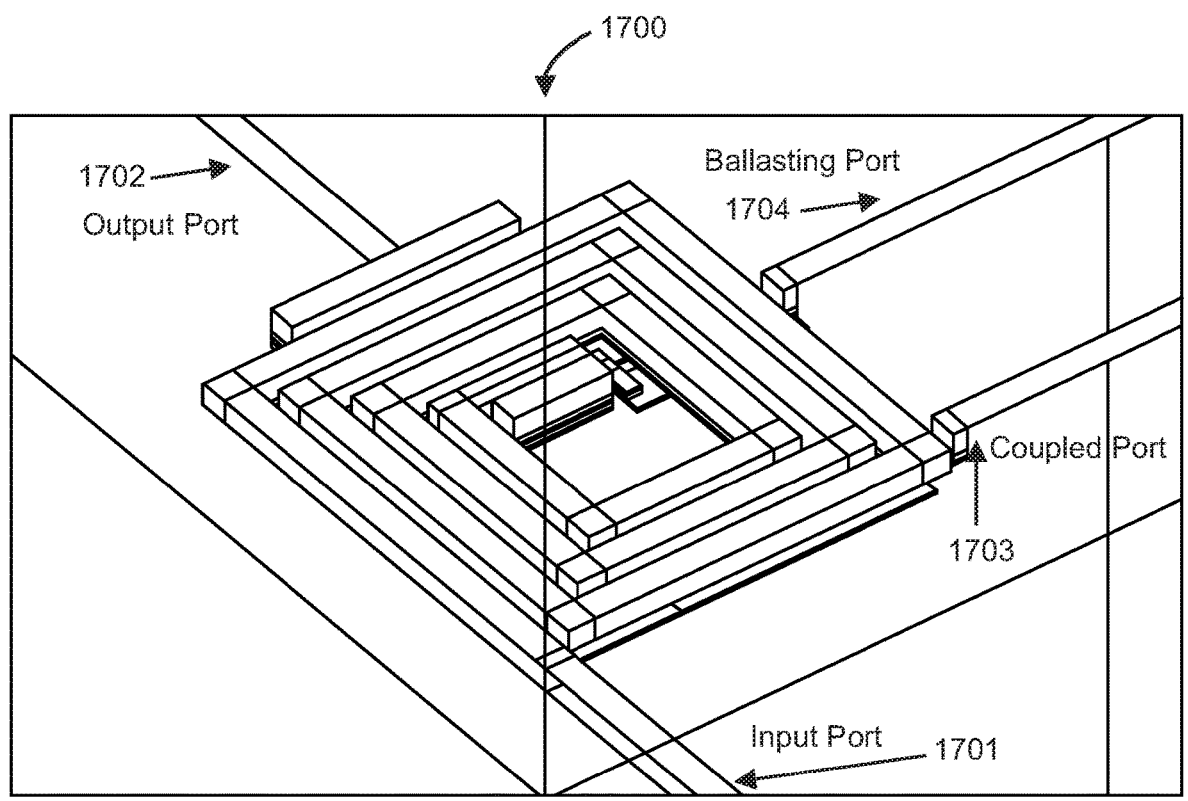
FIG. 17 is a top perspective view of an implementation with conductive traces, in accordance with an implementation of the disclosure.

FIG. 17 is a top perspective view 1700 of the implementation of FIG. 16 with conductive traces. Like schematic-level depiction, the implementation of the directional coupler 800 of FIG. 8 includes the input port 801 (1701), the output port 802 (1702), the coupled port 803 (1703), and the ballasting port 804 (1704). Each of these ports is understood to be the ends of respective connective traces that may be connection points from another component.

Figure 18:
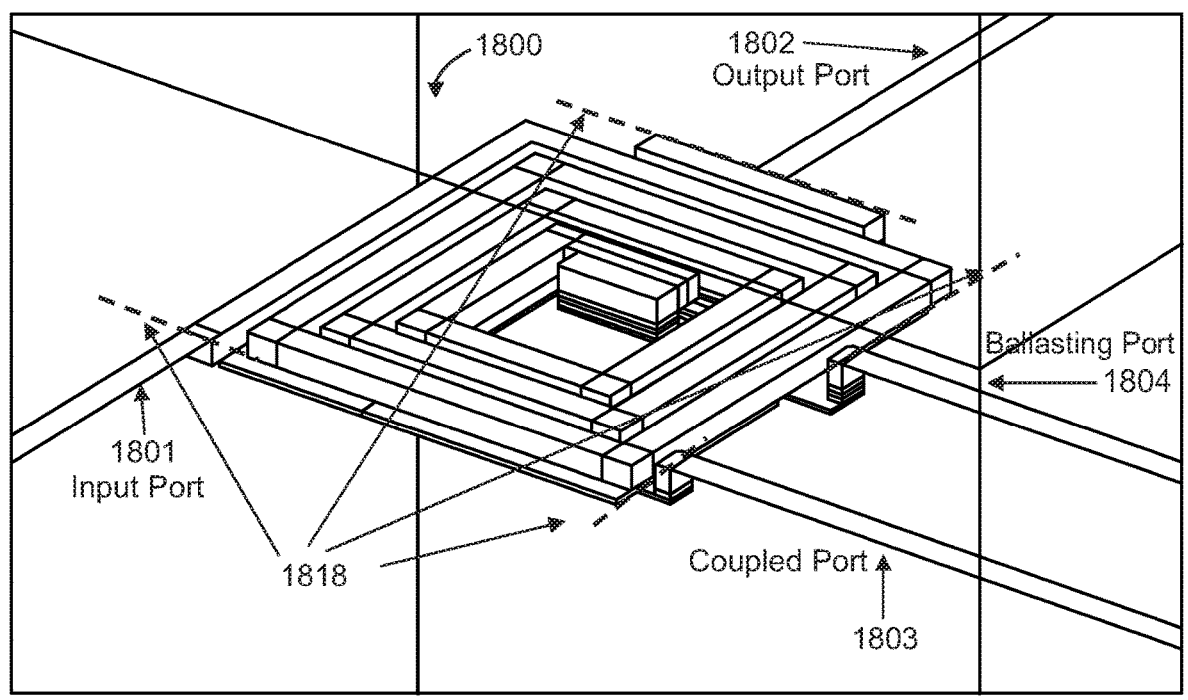
FIG. 18 is another top perspective view of an implementation with conductive traces, in accordance with an implementation of the disclosure.

FIG. 18 is another top perspective view 1800 of the implementation of FIG. 16 with conductive traces. Like schematic-level depiction, the implementation of the directional coupler 800 of FIG. 8 includes the input port 801 (1801), the output port 802 (1802), the coupled port 803 (1803), and the ballasting port 804 (1804). Each of these ports is understood to be the ends of respective connective traces that may be connection points from another component. Reference planes 1818 are used for a simulation.

Figure 19:
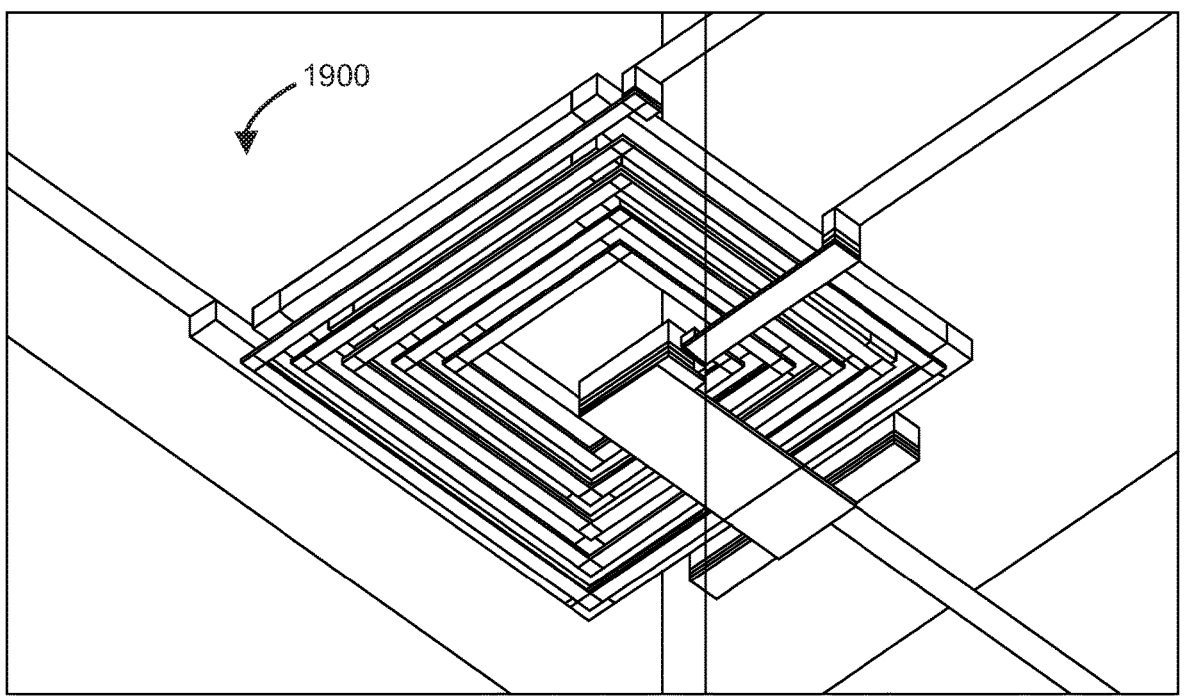
FIG. 19 is another bottom perspective view of an implementation with conductive traces, in accordance with an implementation of the disclosure.

FIG. 19 is another bottom perspective view 1900 of the implementation of FIG. 16 with conductive traces. The bottom perspective view 1900 is depicted without the compensation capacitors between the main signal chain and the ground plane.

Figure 20:
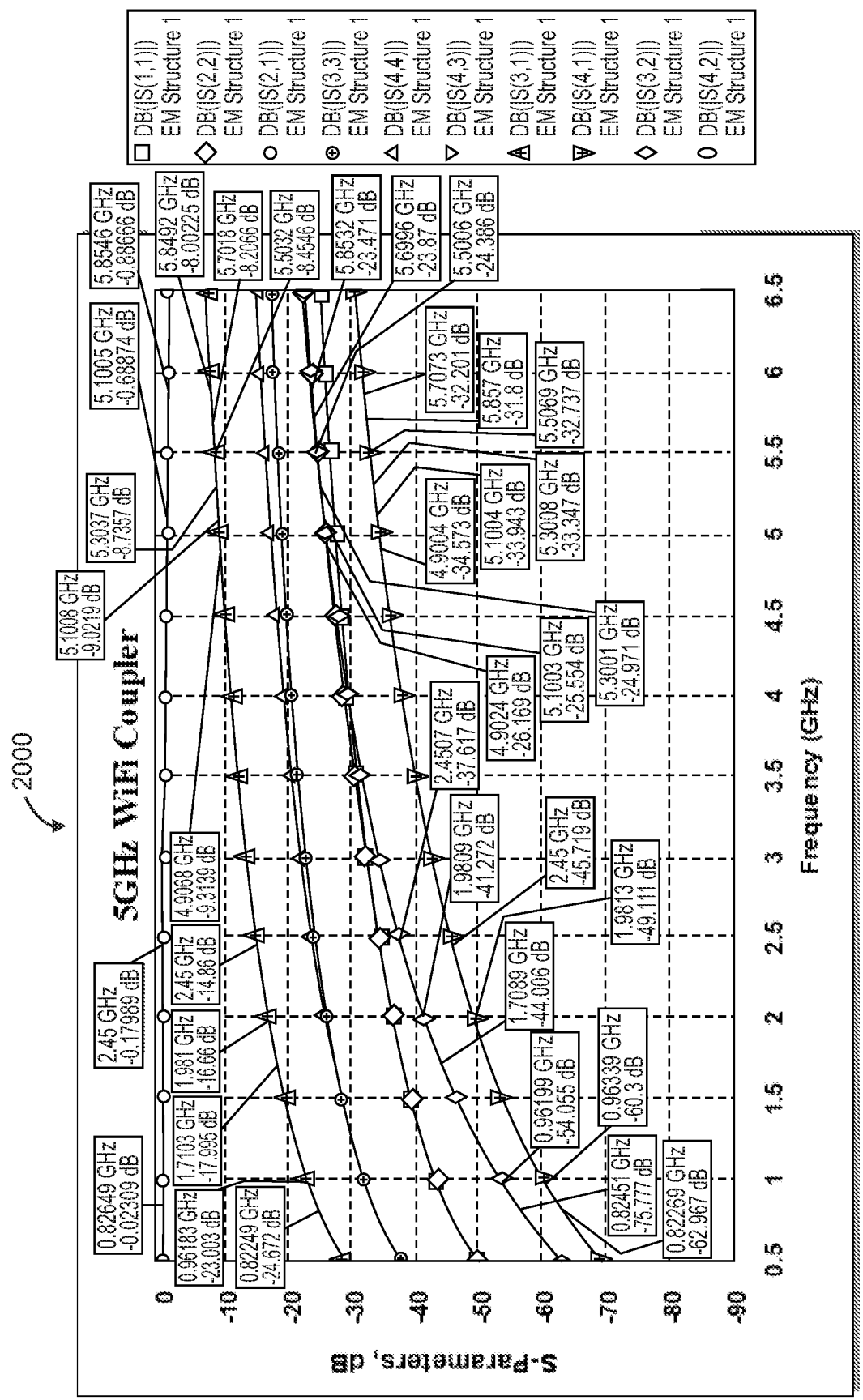
FIG. 20 is a graph showing the scattering parameters (S-parameters) of a directional coupler with the implementation shown in FIG. 15 over an operating frequency range, with the coupling factor, first and second isolation factors, and return losses being detailed.

FIG. 20 is a graph showing the scattering parameters (S-parameters) 2000 of a directional coupler with the implementation shown in FIG. 15 over an operating frequency range, with the coupling factor, first and second isolation factors, and return losses. As they are discussed above, the specific name of the S-parameters and the performance characteristics represented thereby will not be repeated. The plots in FIG. 20 are showing the simulated results for 5 GHz directional coupler. Utilizing different metal layers for the main signal chain and the coupled signal chain inductors may result in smaller footprint area on die compared to prior art.

Figure 21:
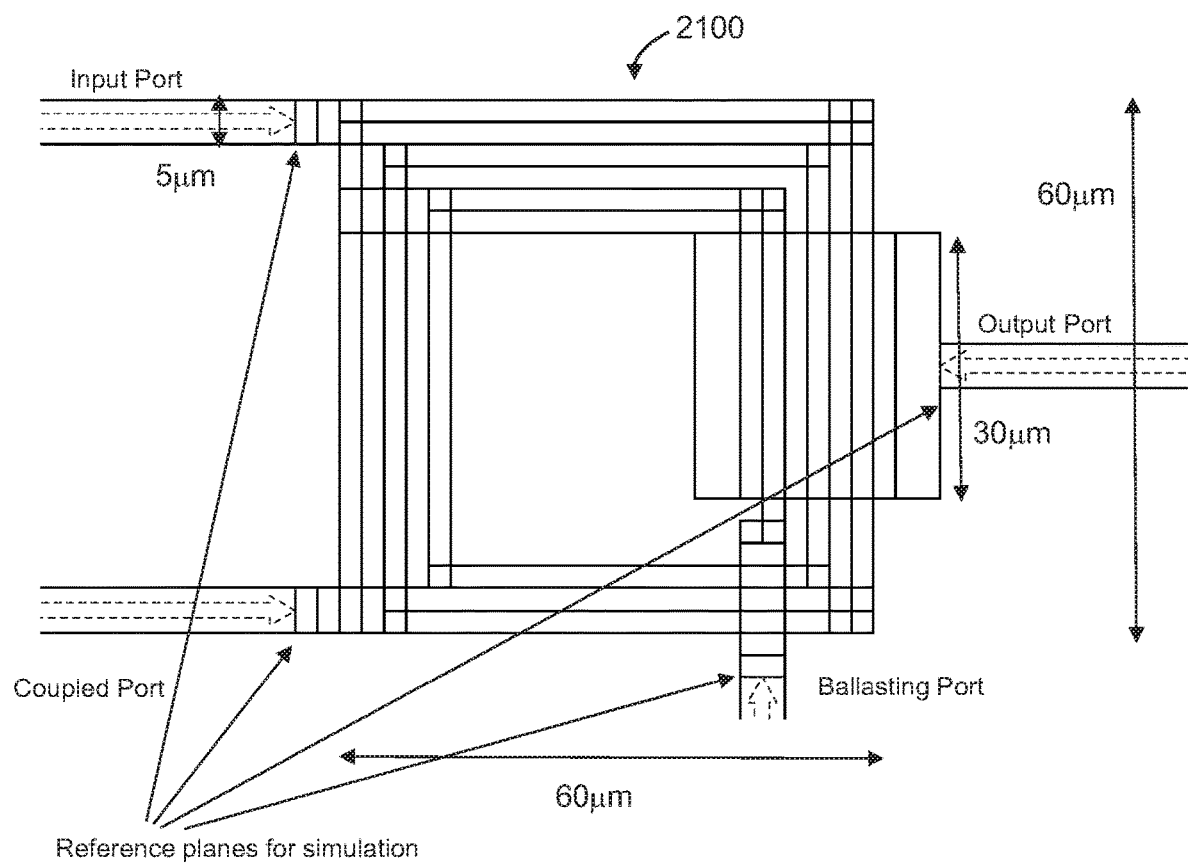
FIG. 21 is a second plan view of the second embodiment and the third embodiment of the directional coupler shown in FIG. 8 and FIG. 9.

FIG. 21 is another plan view 2100 of the directional coupler 800 of FIG. 8 and the implementation of the directional coupler 900 of FIG. 9. An example of an implementation in a silicon semiconductor die is depicted in FIG. 21. Standard layers as in 0.18 µm CMOS process are used with ground plane at the bottom side of the die. Similar to the example of FIG. 16, a first spiral conductive trace has a first outer terminal, a plurality of successive inward turn and an inner terminal that is connected by an underpass to a second outer terminal. Although depicted and described in terms of specific perpendicular turn, it will be recognized that the first spiral conductive trace may instead be defined by a plurality of oblique angle turns, or circular turns, or another otherwise spiral configuration. The first spiral conductive trace has 1.5 inward turns. Throughout its entire length, the first spiral conductive trace has a width of 5 µm and a thickness of 4 µm. The first spiral conductive trace is realized in metal layer M4 of the die. The underpass is realized in metal layer M2. A width of the second outer terminal 1502 is 30 µm.

There is also a second spiral conductive trace that is connected to the coupled port and the ballasting port. More particularly, the second conductive trace is defined by a first outer terminal, a plurality of successive inward turns, and an inner terminal that is connected by an underpass to a second outer terminal. The spacing between any given point on the second spiral conductive trace and the first spiral conductive trace is constant, so the shape and configuration of the second spiral conductive trace is similar to that of the first spiral conductive trace. Accordingly, to the extent that the turns of the first spiral conductive trace is different than the illustrated perpendicular configuration, the turns of the second spiral conductive trace are understood to have such an alternative configuration. The second spiral conductive trace has 2.75 inward turns. Throughout its entire length, the second spiral conductive trace has a width of 2.5 µm and the thickness of 0.5 µm. The second spiral conductive trace is realized in metal layer M3 of the die. It is understood that the second spiral conductive trace is dedicated for the coupled signal path, and accordingly the signal level is lower, thus only narrower conductor is utilized. Together with the first spiral conductive trace and the second spiral conductive trace, the overall dimensions in one exemplary implementation is 60 µm by 60 µm. Reference planes are used for simulation.

Figure 22:
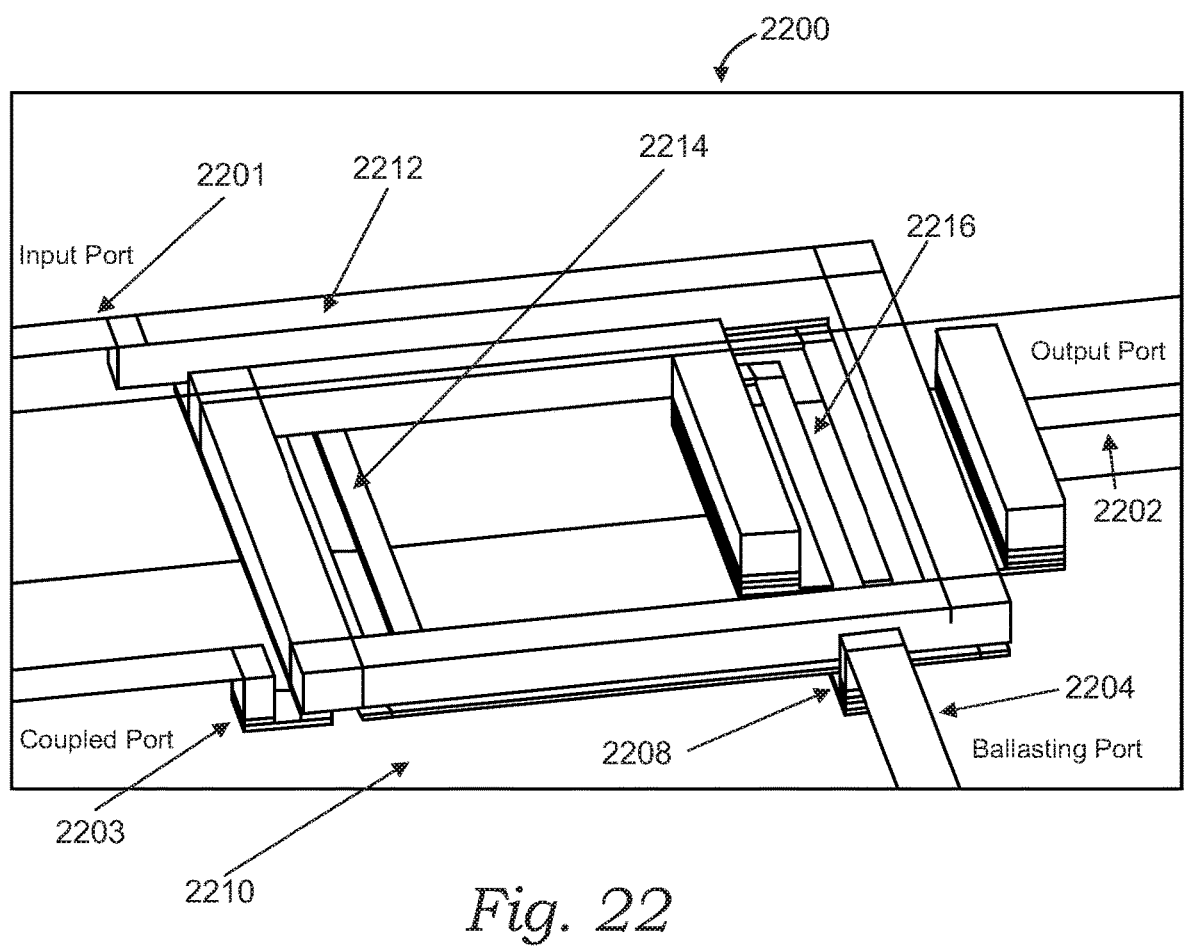
FIG. 22 is a top perspective view of an implementation with conductive traces, in accordance with an implementation of the disclosure.

FIG. 22 is a top perspective view 2200 of the implementation of FIG. 21 with conductive traces. It is understood that the first spiral conductive trace of FIG. 21 is dedicated for a main signal trace 2212, which is realized in metal layer M4. Input port 2201 is understood to be the ends of the main signal trace 2212. It is understood that the second spiral conductive trace of FIG. 21 is dedicated for a coupled inductor trace 2214, which is realized in metal layer M3. Coupled port 2203 is understood to be the ends of the coupled inductor trace 2214, which is realized in metal layer M4. Ballasting port 2204 is connected to the other end of the coupled inductor trace 2214 via a first underpass 2208, which is realized in metal layer M2. Output port 2202 is connected to the other end of the main signal trace 2212 via a second underpass 2216, which is realized in metal layer M2. It is understood that ports 2201-2204 may be connection points from another component. A ground plane 2210 is capacitively coupled to the main signal trace 2212 and the coupled inductor trace 2214 and is at the bottom of a semiconductor die. The first compensation capacitor and the second compensation capacitor of the implementations of the directional coupler of FIG. 8 and FIG. 9 are realized with overlapping area between the metal layers of the main signal trace 2212 and the coupled inductor trace 2214 as well as the wide under paths metals and appropriate inductors' metal traces. The third, fourth, fifth, and sixth compensation capacitors of the other implementations of the directional coupler of FIG. 8 and FIG. 9 are realized between the main signal trace 2212 or the coupled inductor trace 2212, and the ground plane 2210. Adjustment of capacitances of the third, fourth, fifth, and sixth compensation capacitor is implemented via changing semiconductor die thickness.

Figure 23:
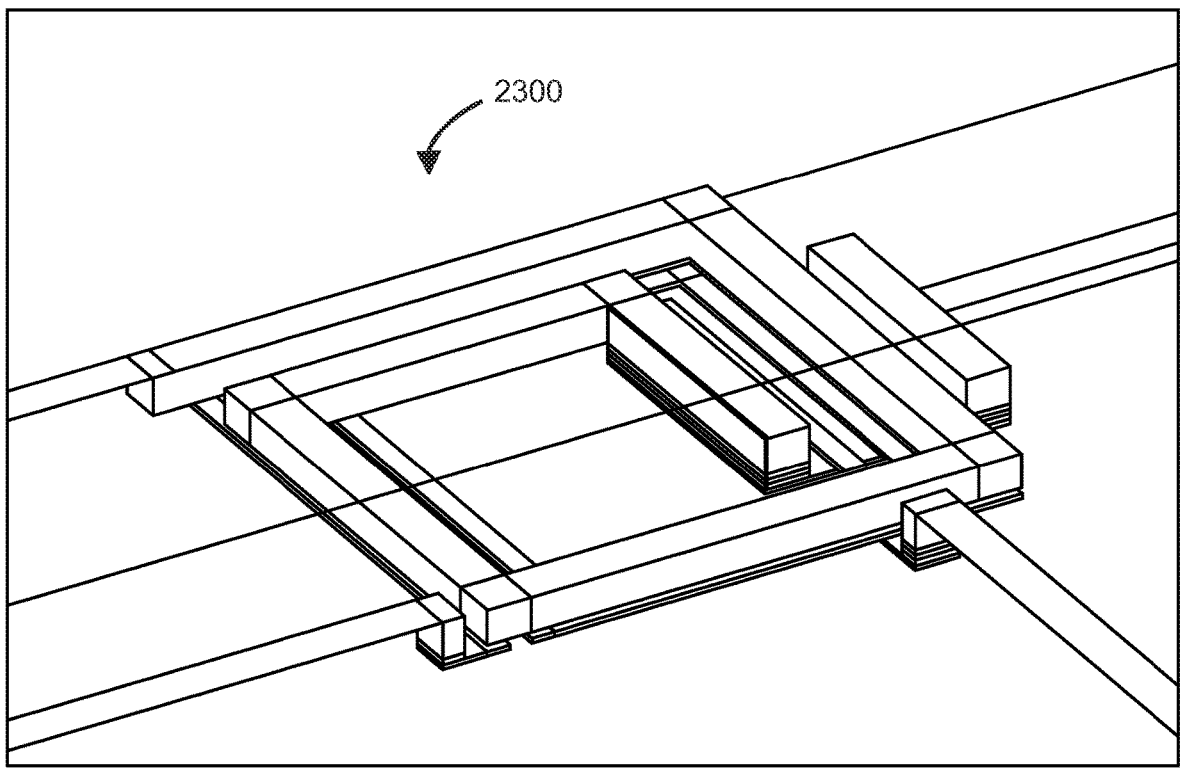
FIG. 23 is another top perspective view of an implementation with conductive traces, in accordance with an implementation of the disclosure.

FIG. 23 is another top perspective view 2300 of the implementation of FIG. 21 with conductive traces.

Figure 24:
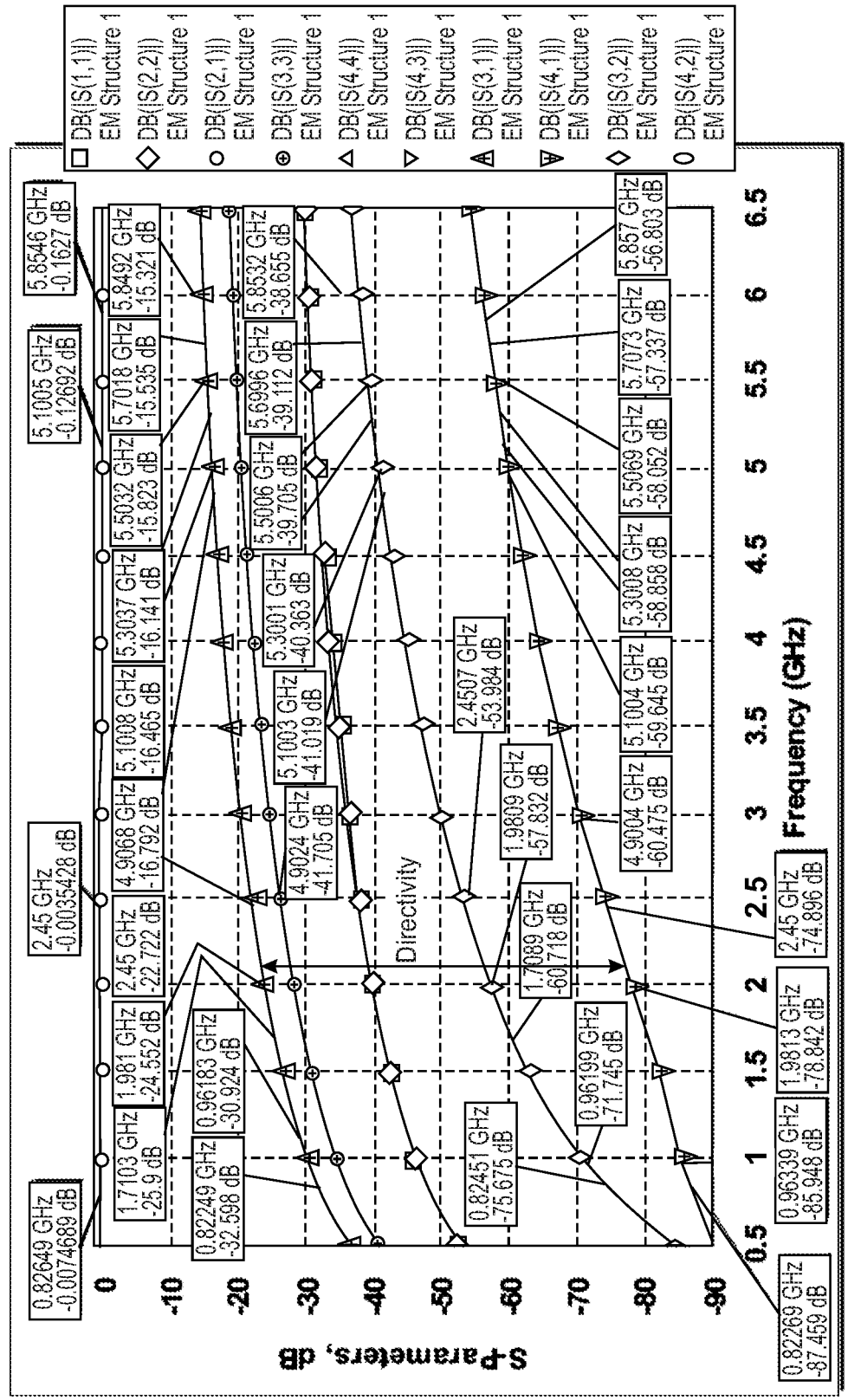
FIG. 24 is a graph showing the scattering parameters (S-parameters) of a directional coupler with the implementation shown in FIG. 21 over an operating frequency range, with the coupling factor, first and second isolation factors, and resultant first and second directivity being detailed.

FIG. 24 is a graph showing the scattering parameters (S-parameters) 2400 of a directional coupler with the implementation shown in FIG. 21 over an operating frequency range, with the coupling factor, first and second isolation factors, and resultant first and second directivity. As they are discussed above, the specific name of the S-parameters and the performance characteristics represented thereby will not be repeated. The plots in FIG. 24 are showing the simulated results for 2 GHz directional coupler. The footprint area is not a focus in the implementation of FIG. 24. High level of directivity may be achieved.

Figure 25:
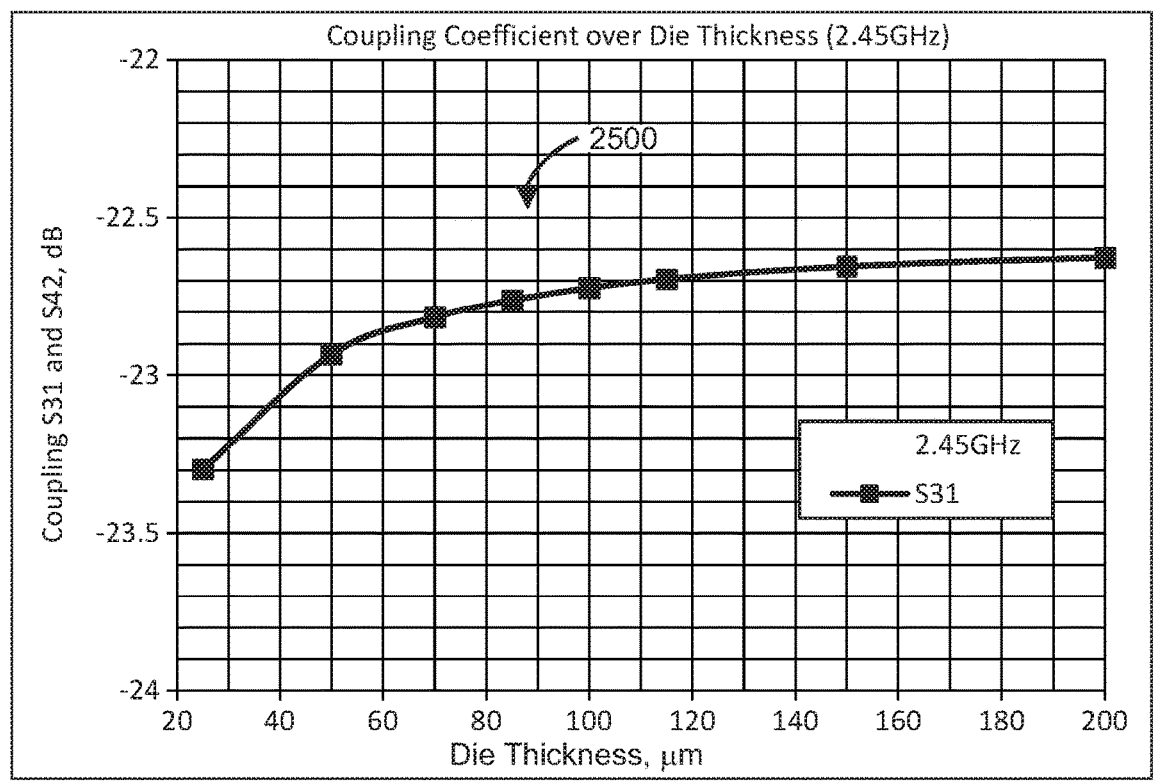
FIG. 25 is a graph plotting a coupling in relation to the semiconductor die thickness, in accordance with an implementation of the disclosure.

FIG. 25 is a graph 2500 plotting the coupling in relation to the semiconductor die thickness. The graph 2500 shows small variation of the coupling coefficient S31 and S42 over changing semiconductor die thicknesses at a particular frequency of 2.45 GHz.

Figure 26:
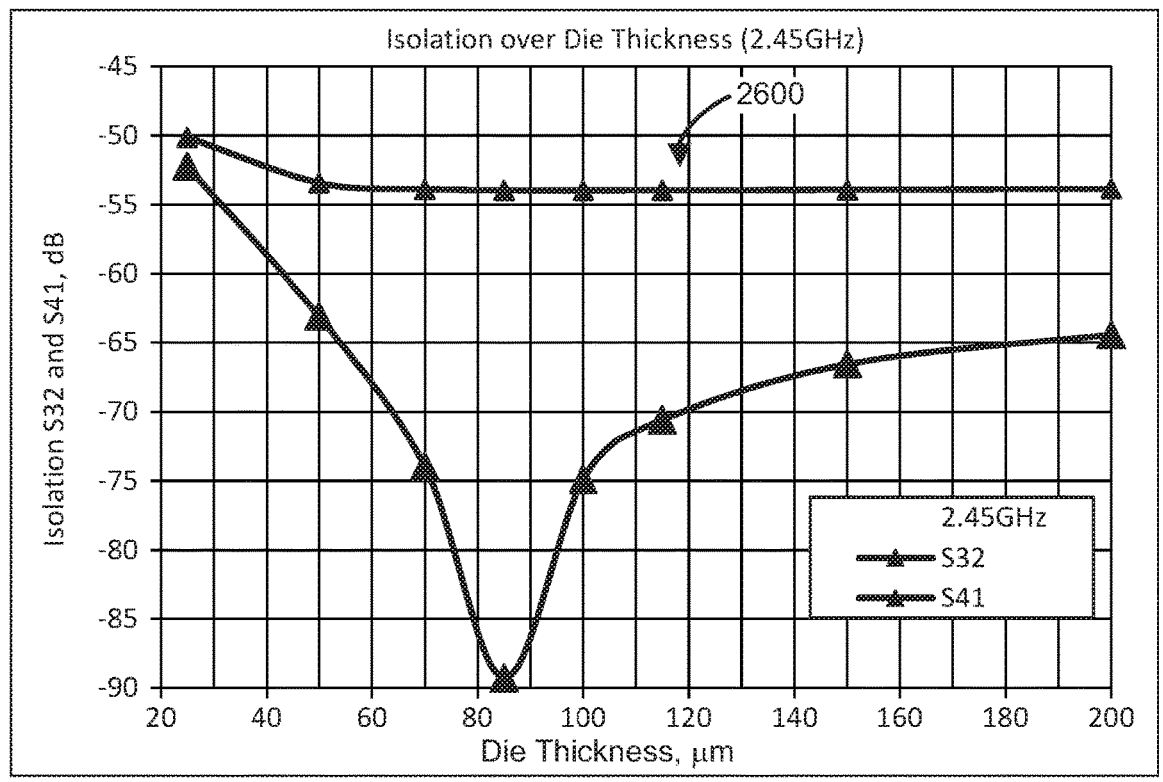
FIG. 26 is a graph plotting an isolation in relation to the semiconductor die thickness, in accordance with an implementation of the disclosure.

FIG. 26 is a graph 2600 plotting the isolation in relation to the semiconductor die thickness. The graph 2600 shows that isolation S32 varies little as a semiconductor die thickness increases at a particular frequency of 2.45 GHz while isolation S41 varies widely over changing the semiconductor die thickness at the same frequency.

Figure 27:
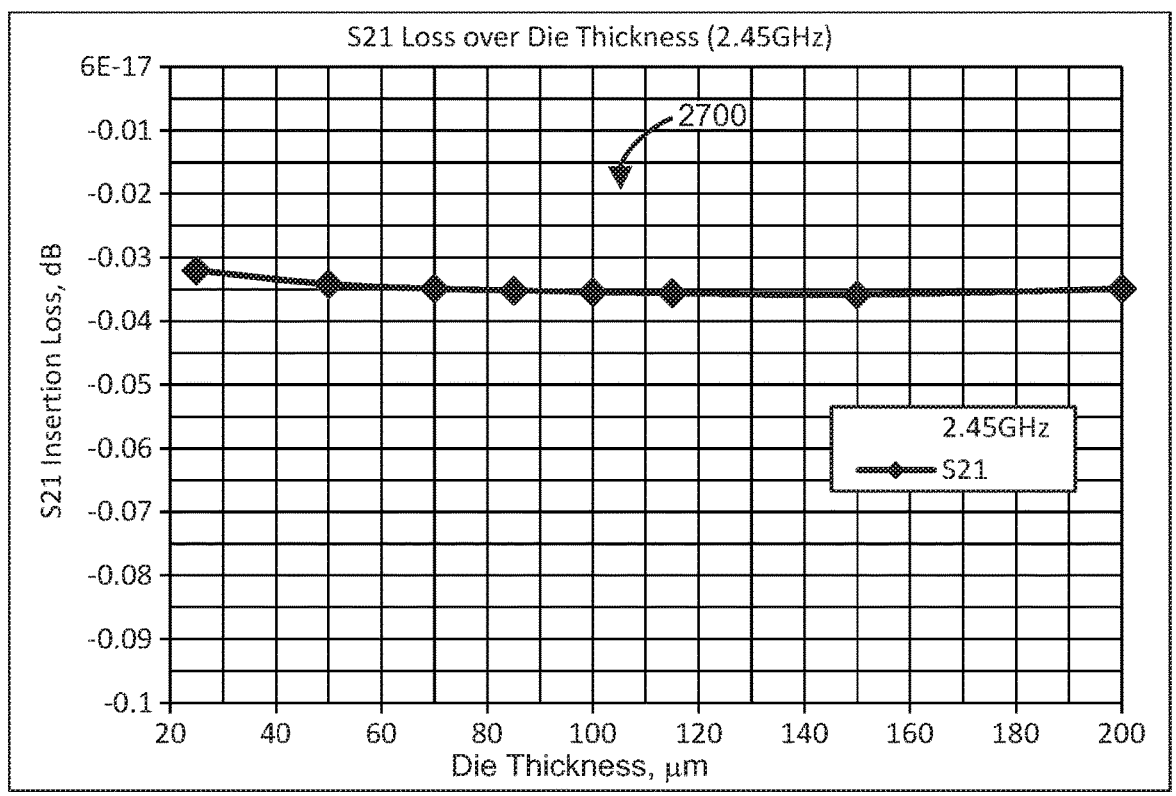
FIG. 27 is a graph plotting an insertion loss in relation to the semiconductor die thickness, in accordance with an implementation of the disclosure.

FIG. 27 is a graph 2700 plotting the insertion loss in relation to the semiconductor die thickness. The graph 2700 shows very little change of insertion loss S21 over changing semiconductor die thickness at a particular frequency of 2.45 GHz.

Figure 28:
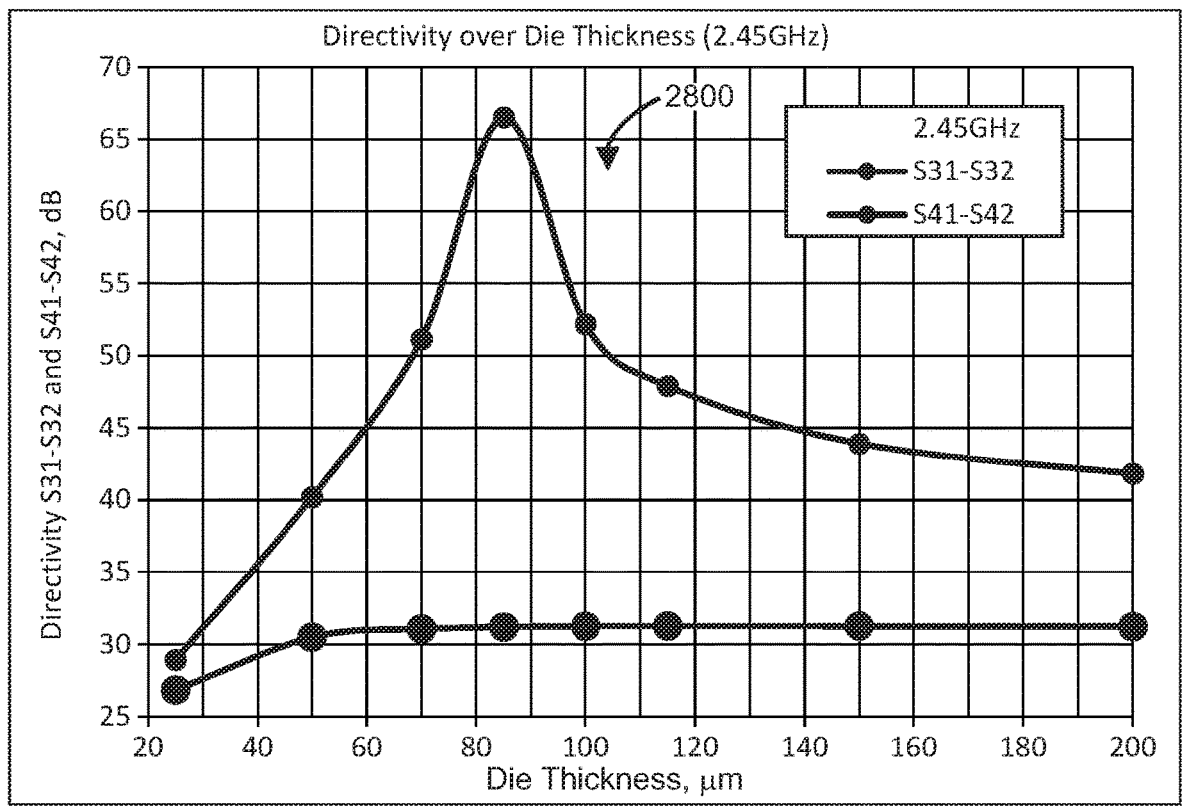
FIG. 28 is a graph plotting directivity in relation to the semiconductor die thickness, in accordance with an implementation of the disclosure.

FIG. 28 is a graph 2800 plotting the directivity in relation to the semiconductor die thickness. The graph 2800 shows small variation of directivity S31-S32 over changing a semiconductor die thickness at a particular frequency of 2.45 GHz while wide variation of S41-S42 is shown over changing the semiconductor die thickness at the same frequency.

Figure 29:
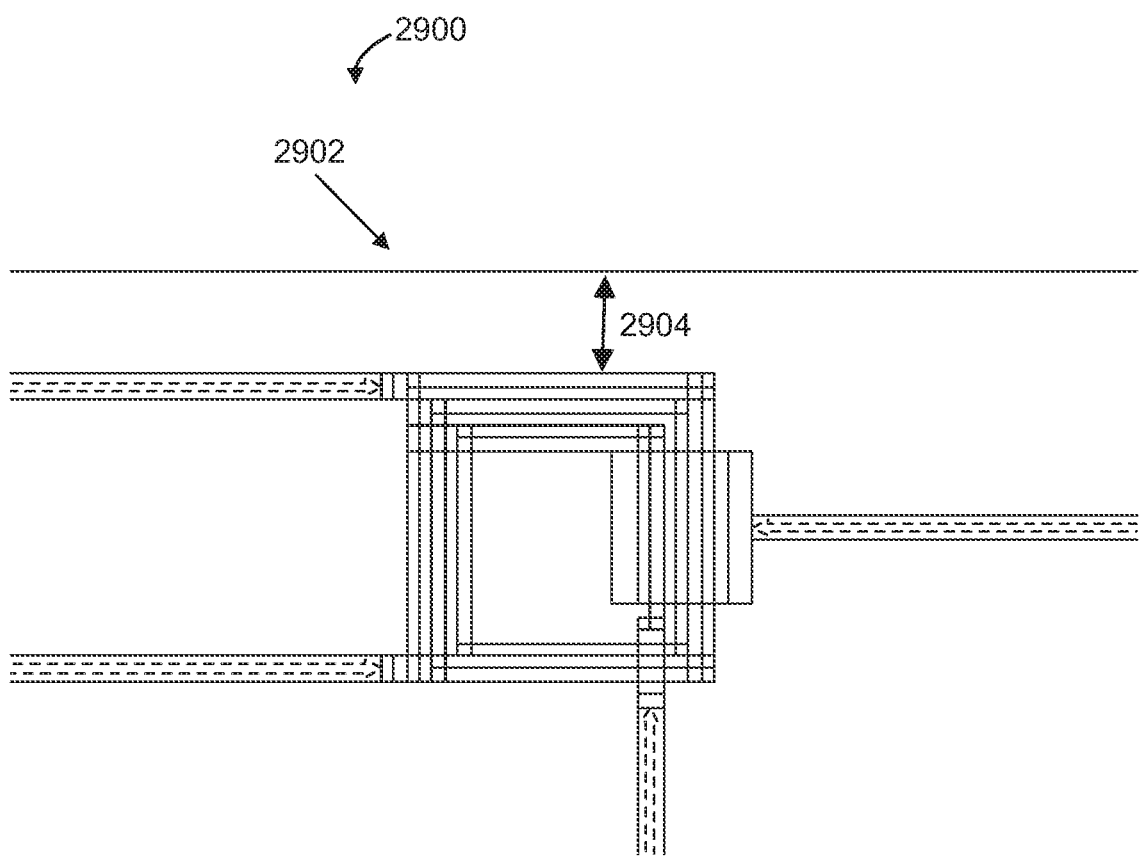
FIG. 29 is a third plan view of the second embodiment and the third embodiment of the directional coupler shown in FIG. 8 and FIG. 9.

FIG. 29 is another plan view 2900 of the directional coupler 800 of FIG. 8 and the directional coupler 900 of FIG. 9. The implementation of the plan view 2900 is similar to the implementation of FIG. 21. Standard layers as in 0.18 μm CMOS process are used with ground plane at the bottom side of the die as well as an additional ground plane 2902 at top metal layer of the die, for example, M4. Similar to the implementation of FIG. 21, a first spiral conductive trace has a first outer terminal, a plurality of successive inward turn and an inner terminal that is connected by an underpass to a second outer terminal. Although depicted and described in terms of specific perpendicular turn, it will be recognized that the first spiral conductive trace may instead be defined by a plurality of oblique angle turns, or circular turns, or another otherwise spiral configuration. The first spiral conductive trace has 1.5 inward turns. Throughout its entire length, the first spiral conductive trace has a width of 5 μm and a thickness of 4 μm. The first spiral conductive trace is realized in metal layer M4 of the die. The underpass is realized in metal layer M2.

There is also a second spiral conductive trace that is connected to the coupled port and the ballasting port. More particularly, the second conductive trace is defined by a first outer terminal, a plurality of successive inward turns, and an inner terminal that is connected by an underpass to a second outer terminal. The spacing between any given point on the second spiral conductive trace and the first spiral conductive trace is constant, so the shape and configuration of the second spiral conductive trace is similar to that of the first spiral conductive trace. Accordingly, to the extent that the turns of the first spiral conductive trace is different than the illustrated perpendicular configuration, the turns of the second spiral conductive trace are understood to have such an alternative configuration. The second spiral conductive trace has 2.75 inward turns. Throughout its entire length, the second spiral conductive trace has a width of 2.5 μm and the thickness of 0.5 μm. The second spiral conductive trace is realized in metal layer M3 of the die. It is understood that the second spiral conductive trace is dedicated for the coupled signal path, and accordingly the signal level is lower, thus only narrower conductor is utilized. Together with the first spiral conductive trace and the second spiral conductive trace, the overall dimensions in one exemplary implementation is the same as the dimension of the implementation of FIG. 21.

Underpasses for the main signal and the coupled chain are realized in metal layer M2. The first and the second compensation capacitors are realized with overlapping area between the main signal trace in metal layer M4 and the coupled inductor trace in metal layer M3 as well as wide underpass metals in metal layer M2 and appropriate inductors' metal traces. The third, fourth, fifth, and sixth compensation capacitors are realized between appropriate metal traces and the ground plane at the bottom of the semiconductor die as well as the ground plane 2902 at the top metal layer. Adjustment of capacitances of the third, fourth, fifth, and sixth capacitors is implemented via changing distance 2904 from the metal traces of a directional coupler to the ground plane 2902 at the top metal layer.

Figure 30:
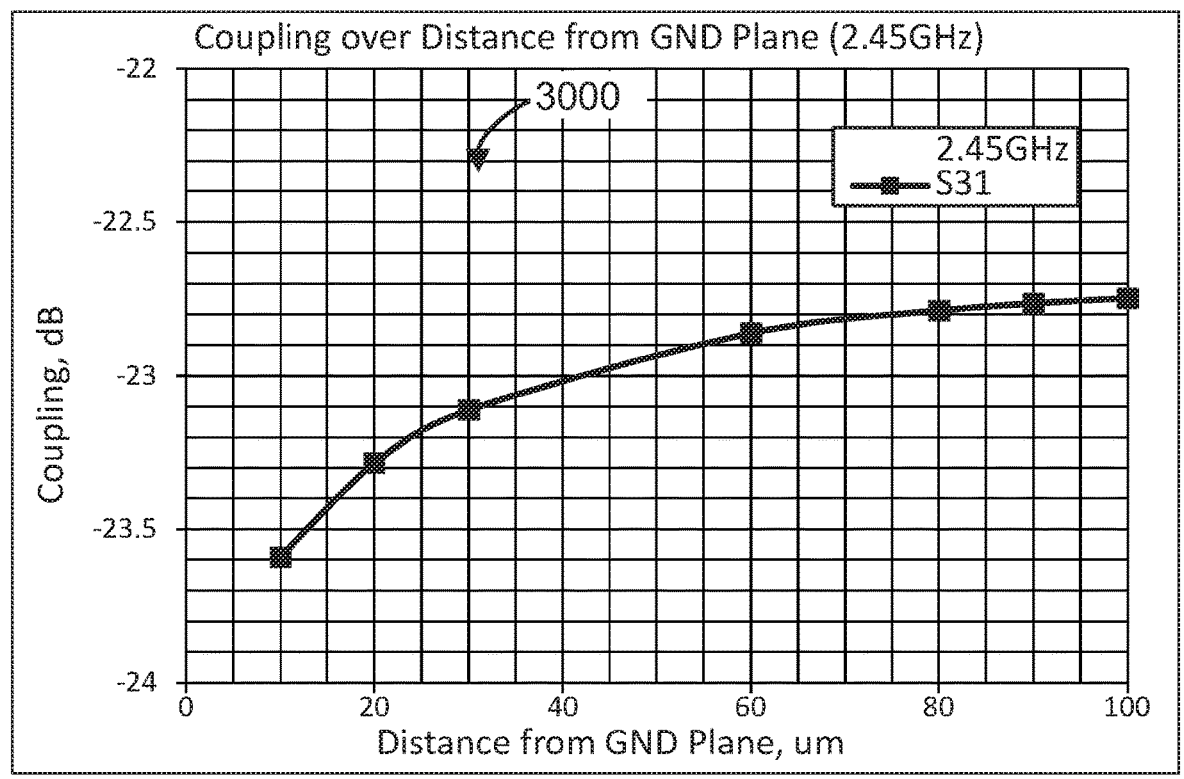
FIG. 30 is a graph plotting a coupling in relation to the distance from the ground plane, in accordance with an implementation of the disclosure.

FIG. 30 is a graph 3000 plotting the coupling in relation to the distance from the ground plane. The graph 3000 shows small variation of the coupling coefficient S31 and S42 over changing distance from a ground plane at the top of a semiconductor die at a particular frequency of 2.45 GHz.

Figure 31:
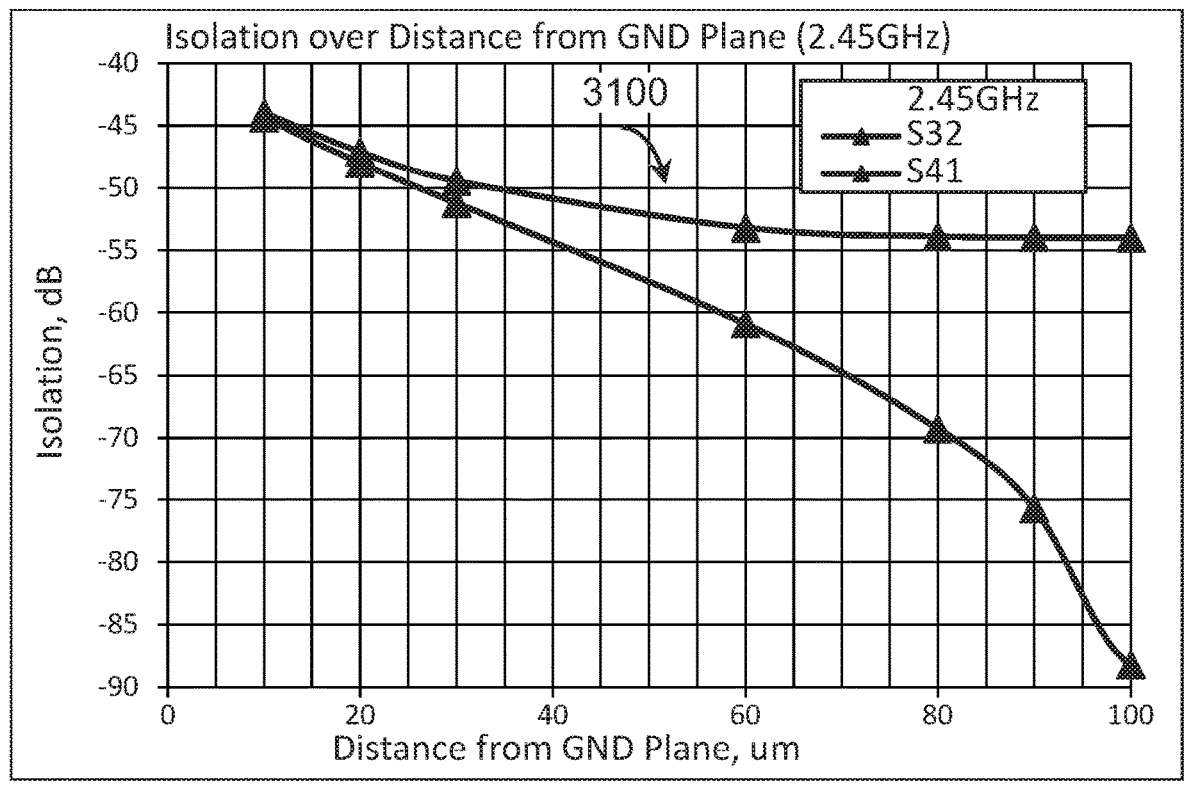
FIG. 31 is a graph plotting an isolation in relation to the distance from the ground plane, in accordance with an implementation of the disclosure.

FIG. 31 is a graph 3100 plotting the isolation in relation to the distance from the ground plane. The graph 3100 shows that isolation S32 varies little as distance from a ground plane at the top of a semiconductor increases at a particular frequency of 2.45 GHz, while isolation S41 varies widely over changing distance from a ground plane at the top of a semiconductor at the same frequency.

Figure 32:
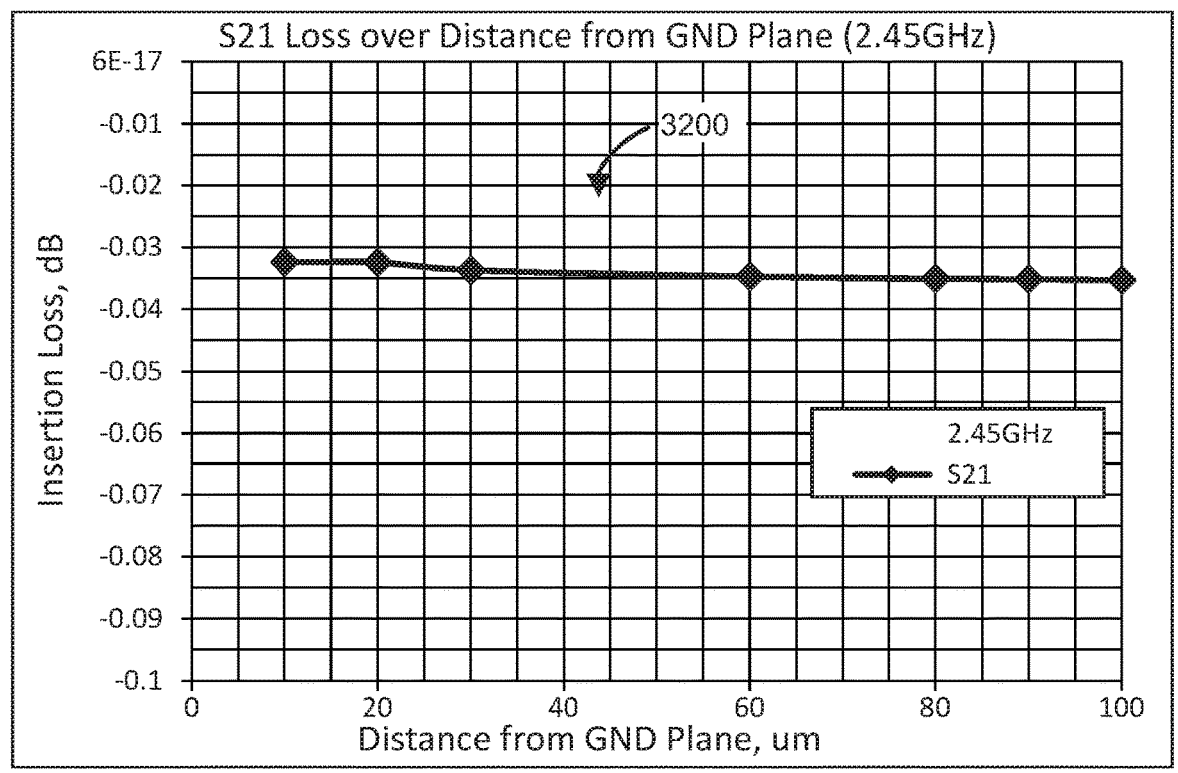
FIG. 32 is a graph plotting an insertion loss in relation to the distance from the ground plane, in accordance with an implementation of the disclosure.

FIG. 32 is a graph 3200 plotting the insertion loss in relation to the distance from the ground plane. The graph 3200 shows very little change of insertion loss S21 over changing distance from a ground plane at the top of a semiconductor at a particular frequency of 2.45 GHz.

Figure 33:
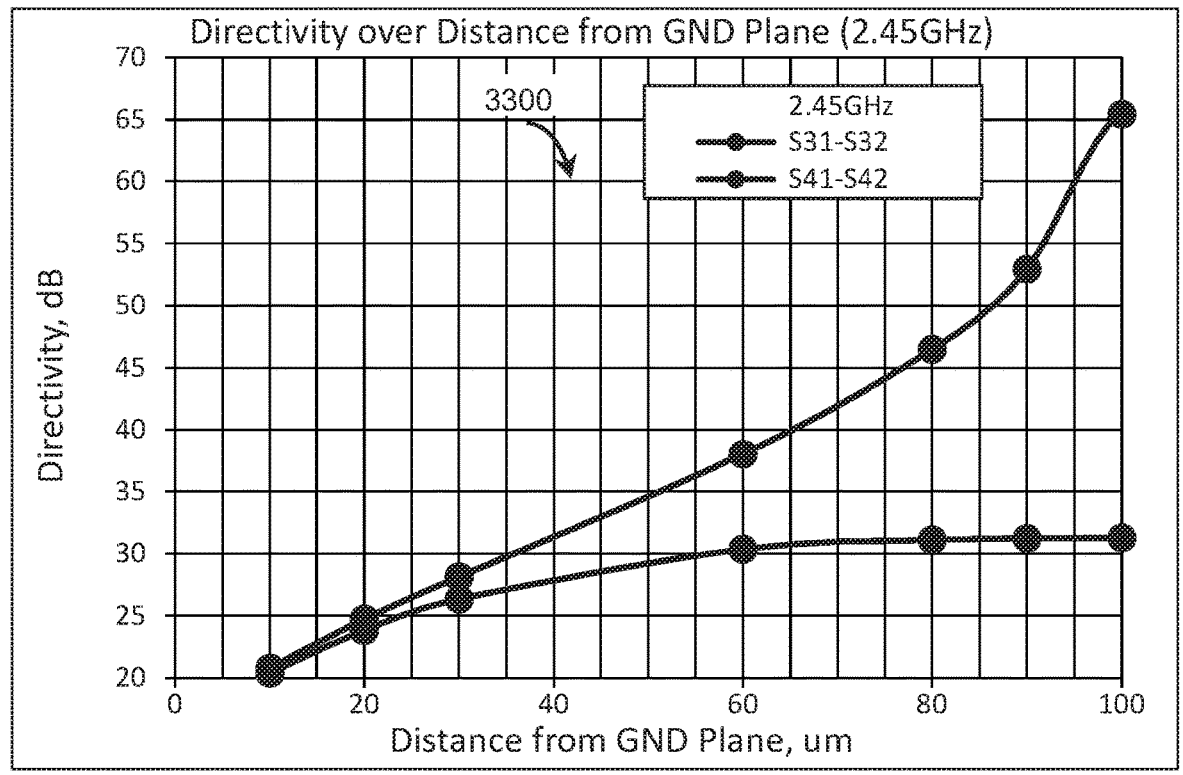
FIG. 33 is a graph plotting directivity in relation to the distance from the ground plane, in accordance with an implementation of the disclosure.

FIG. 33 is a graph 3300 plotting the directivity in relation to the distance from the ground plane. The graph 3300 shows a little variation of directivity S31-S32 over changing distance from a ground plane at the top of a semiconductor at a particular frequency of 2.45 GHz, while wide variation of S41-S42 is shown over changing distance from a ground plane at the top of a semiconductor at the same frequency.

In the foregoing description, numerous details are set forth. It may be apparent, however, that the disclosure may be practiced without these specific details. In some instances, well-known structures and devices are shown in block diagram form, rather than in detail, in order to avoid obscuring the disclosure.

For purposes of this disclosure, any element mentioned in the singular also includes the plural.

Whereas many alterations and modifications of the disclosure may no doubt become apparent to a person of ordinary skill in the art after having read the foregoing description, it is to be understood that any particular example shown and described by way of illustration is in no way intended to be considered limiting. Therefore, references to details of various examples are not intended to limit the scope of the claims, which in themselves recite only those features regarded as the disclosure.

What is claimed is:

1. A directional coupler, comprising:
   a first port;
   a second port;
   a third port;
   a fourth port;
   a first inductor having a first connection to the first port and a second connection to the second port;
   a second inductor having a first connection to the third port and a second connection to the fourth port;
   a first compensation capacitor connected to the first port and the third port; and
   a second compensation capacitor connected to the first port and the fourth port;
   wherein the first inductor is inductively coupled to the second inductor by a predefined coupling factor, the third port being isolated from the first port by a predefined first isolation factor, and the fourth port being isolated from the first port by a predefined second isolation factor, and
   wherein an inductance of the second inductor is substantially greater than an inductance of the first inductor.

2. The directional coupler of claim 1, further comprising a third compensation capacitor, wherein a capacitance of the third compensation capacitor is lower than a capacitance of the first compensation capacitor.

3. The directional coupler of claim 2, further comprising a fourth compensation capacitor, wherein a capacitance of the fourth compensation capacitor is greater than a value of the second compensation capacitor.

4. The directional coupler of claim 1, further comprising a fifth compensation capacitor and a sixth compensation capacitor.

5. The directional coupler of claim 4, wherein a capacitance of the fifth compensation capacitor is ten times higher than a capacitance of the sixth compensation capacitor, wherein a capacitance of the sixth compensation capacitor is twice as high as a capacitance of the first compensation capacitor.

6. The directional coupler of claim 1, wherein a first directivity defined by the predefined coupling factor and the first isolation factor is different from a second directivity defined by the predefined coupling factor and the second isolation factor.

7. The directional coupler of claim 1, wherein an inductance of the second inductor is at least two times greater than an inductance of the first inductor.

8. A directional coupler, comprising:
   a first port;
   a second port;
   a third port;
   a fourth port;
   a first inductor having a first connection to the first port and a second connection to the second port;
   a second inductor having a first connection to the third port and a second connection to the fourth port;
   a first compensation capacitor connected to the first port and the third port;
   a second compensation capacitor connected to the first port and the fourth port;
   a third compensation capacitor connected to the first port and a first node; and
   a fourth compensation capacitor connected to the second port and a second node;
   wherein an inductance of the second inductor is substantially greater than an inductance of the first inductor.

9. The directional coupler of claim 8, wherein a value of the third compensation capacitor is approximately one order of magnitude lower than a value of the first compensation capacitor.

10. The directional coupler of claim 8, wherein a magnitude of a capacitance of the third compensation capacitor is ten times lower than a magnitude of a capacitance of the fourth compensation capacitor.

11. The directional coupler of claim 8, wherein a capacitance of the third compensation capacitor is twice higher than a capacitance of the first compensation capacitor.

12. The directional coupler of claim 8, wherein a capacitance of the fourth compensation capacitor is three times higher than a capacitance of the second compensation capacitor.

13. The directional coupler of claim 8, wherein a capacitance of the fourth compensation capacitor is four times higher than a capacitance of the second compensation capacitor.

14. The directional coupler of claim 8, wherein an inductance of the second inductor is at least two times greater than an inductance of the first inductor.

15. The directional coupler of claim 8, wherein each of the first node and the second node comprise a ground node.

16. A directional coupler, comprising:
   a first port;
   a second port;
   a third port;
   a fourth port;
   a first inductor having a first connection to the first port and a second connection to the second port;
   a second inductor having a first connection to the third port and a second connection to the fourth port;
   a first compensation capacitor connected to the first port and the third port;
   a second compensation capacitor connected to the first port and the fourth port;
   a third compensation capacitor connected to the first port and a first node;
   a fourth compensation capacitor connected to the second port and a second node;
   a fifth compensation capacitor connected to the first node and the third port; and
   a sixth compensation capacitor connected to the second node and the fourth port;

wherein the first inductor is inductively coupled to the second inductor by a predefined coupling factor, the third port being isolated from the first port by a predefined first isolation factor, and the fourth port being isolated from the first port by a predefined second isolation factor, and wherein an inductance of the second inductor is substantially greater than an inductance of the first inductor.

17. The directional coupler of claim 16, wherein each of the first node and the second node comprise a ground node.

18. The directional coupler of claim 16, wherein a capacitance of the sixth compensation capacitor is two times higher than a capacitance of the second compensation capacitor.

19. The directional coupler of claim 16, wherein a capacitance of the fifth compensation capacitor is three times lower than a capacitance of the third compensation capacitor.

20. The directional coupler of claim 16, a capacitance of the fourth compensation capacitor is higher than all other capacitances.

* * * * *